US012754256B2

(12) United States Patent
Pihan et al.

(10) Patent No.: US 12,754,256 B2
(45) Date of Patent: Oct. 6, 2026

(54) MAGNETIC SENSOR ASSEMBLY

(71) Applicant: Applied Materials, Inc., Santa Clara, CA (US)

(72) Inventors: Clemens Pihan, Darmstadt (DE); Sven Langhoff, Darmstadt (DE)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 18/661,346

(22) Filed: May 10, 2024

(65) Prior Publication Data

US 2025/0347714 A1 Nov. 13, 2025

(51) Int. Cl.
*G01R 33/00* (2006.01)
*G01D 5/14* (2006.01)
(Continued)

(52) U.S. Cl.
CPC ......... *G01R 33/0047* (2013.01); *G01D 5/145* (2013.01); *G01R 33/072* (2013.01); *G01R 33/091* (2013.01); *G01R 33/093* (2013.01); *G01R 33/096* (2013.01); *G01R 33/098* (2013.01)

(58) Field of Classification Search
CPC ........ H02K 41/02; H02K 11/20; H02K 11/21; H02K 11/215; H02N 15/00; H02N 15/02; H02N 15/04; H01L 21/677; H01L 21/67709; H01L 21/68; G01R 33/0074; G01R 33/07; G01R 33/072; G01R 33/09;
(Continued)

(56) References Cited

U.S. PATENT DOCUMENTS 5,180,048 A 1/1993 Kawada et al.
5,488,294 A 1/1996 Liddell et al.
(Continued)

FOREIGN PATENT DOCUMENTS

CN 101158852 A 4/2008
CN 113707585 A 11/2021
(Continued)

OTHER PUBLICATIONS

International Search Report and Written Opinion in related application PCT/US2025/028709 dated Sep. 15, 2025.
(Continued)

*Primary Examiner* — David M Schindler
(74) *Attorney, Agent, or Firm* — Patterson + Sheridan, LLP

(57) ABSTRACT

A magnetic sensor includes a sensor housing, a magnet, a printed circuit board assembly, a first sensor element, and a second sensor element. The sensor housing includes a pocket and a magnet opening. The magnet is disposed in the magnet opening. The printed circuit board assembly is disposed in the pocket. The printed circuit board assembly includes a first portion and a second portion. The first sensor element and the second sensor element are disposed on the second portion. The first sensor element and second sensor element are configured to measure magnetic flux density, and the magnetic flux generated by the magnet is configured to pass through the first sensor element in a first direction and pass through the second sensor element in a second direction that is opposite to the first direction.

18 Claims, 9 Drawing Sheets

(51) Int. Cl.
*G01R 33/07* (2006.01)
*G01R 33/09* (2006.01)

(58) Field of Classification Search
CPC .. G01R 33/091; G01R 33/093; G01R 33/095; G01R 33/096; G01R 33/098; G01D 5/145
See application file for complete search history.

(56) References Cited

U.S. PATENT DOCUMENTS

| | | | |
|---|---|---|---|
| 5,569,350 | A | 10/1996 | Osada et al. |
| 5,641,054 | A | 6/1997 | Mori et al. |
| 6,157,106 | A | 12/2000 | Tietz et al. |
| 6,206,176 | B1 | 3/2001 | Blonigan et al. |
| 6,231,716 | B1 | 5/2001 | White et al. |
| 7,293,950 | B2 | 11/2007 | Bonora et al. |
| 7,438,175 | B2 | 10/2008 | White et al. |
| 7,841,820 | B2 | 11/2010 | Bonora et al. |
| 7,948,122 | B2 | 5/2011 | Compter et al. |
| 7,964,038 | B2 | 6/2011 | Patalay et al. |
| 7,994,486 | B2 | 8/2011 | Smick et al. |
| 8,104,951 | B2 | 1/2012 | Aderhold et al. |
| 8,851,817 | B2 | 10/2014 | Bonora et al. |
| 9,390,950 | B2 | 7/2016 | Sorabji et al. |
| 9,588,443 | B2 | 3/2017 | Shibazaki |
| 9,964,863 | B1 | 5/2018 | Babayan et al. |
| 10,204,810 | B2 | 2/2019 | Hoey et al. |
| 10,236,197 | B2 | 3/2019 | Janakiraman et al. |
| 10,256,124 | B2 | 4/2019 | Mooring |
| 10,262,887 | B2 | 4/2019 | Hao et al. |
| 10,283,397 | B2 | 5/2019 | Willwerth et al. |
| 10,460,977 | B2 | 10/2019 | Breninger et al. |
| 10,483,141 | B2 | 11/2019 | Janakiraman et al. |
| 10,490,436 | B2 | 11/2019 | Ghosh et al. |
| 10,734,265 | B2 | 8/2020 | Janakiraman et al. |
| 10,770,337 | B2 | 9/2020 | Lee et al. |
| 10,784,142 | B2 | 9/2020 | Marcelynas et al. |
| 10,851,453 | B2 | 12/2020 | Tsai et al. |
| 10,892,180 | B2 | 1/2021 | Chia et al. |
| 11,232,965 | B2 | 1/2022 | Newman et al. |
| 11,377,310 | B2 | 7/2022 | Aust et al. |
| 11,508,595 | B2 | 11/2022 | Aust et al. |
| 11,527,424 | B2 | 12/2022 | Berger et al. |
| 12,273,051 | B2 | 4/2025 | Meiss et al. |
| 12,381,101 | B2 | 8/2025 | Prasad et al. |
| 2002/0108842 | A1 | 8/2002 | Bonora et al. |
| 2003/0178145 | A1 | 9/2003 | Anderson et al. |
| 2003/0219977 | A1 | 11/2003 | Pomarede et al. |
| 2004/0023495 | A1 | 2/2004 | Butterfield et al. |
| 2004/0058293 | A1 | 3/2004 | Nguyen et al. |
| 2004/0255442 | A1 | 12/2004 | McDiarmid et al. |
| 2006/0102078 | A1 | 5/2006 | Fairbairn et al. |
| 2006/0156981 | A1 | 7/2006 | Fondurulia et al. |
| 2007/0160507 | A1 | 7/2007 | Satoh et al. |
| 2007/0269297 | A1 | 11/2007 | Meulen et al. |
| 2008/0175694 | A1 | 7/2008 | Park et al. |
| 2008/0232947 | A1 | 9/2008 | van der Meulen et al. |
| 2008/0265876 | A1 | 10/2008 | Lee et al. |
| 2008/0266037 | A1 | 10/2008 | Williams |
| 2009/0314211 | A1 | 12/2009 | Du Bois et al. |
| 2010/0062592 | A1 | 3/2010 | Clark |
| 2010/0136773 | A1 | 6/2010 | Akae et al. |
| 2010/0226737 | A1 | 9/2010 | Sakaue et al. |
| 2011/0312189 | A1 | 12/2011 | Kim et al. |
| 2012/0109355 | A1 | 5/2012 | Baccini et al. |
| 2012/0213614 | A1 | 8/2012 | Bonora et al. |
| 2012/0249291 | A1 | 10/2012 | Holcomb et al. |
| 2013/0171757 | A1 | 7/2013 | Ponnekanti et al. |
| 2014/0020629 | A1 | 1/2014 | Tsai et al. |
| 2018/0339816 | A1 | 11/2018 | Oldendorf et al. |
| 2018/0374732 | A1 | 12/2018 | Klein et al. |
| 2019/0348264 | A1 | 11/2019 | Tsai et al. |
| 2020/0026060 | A1 | 1/2020 | Takato |
| 2020/0232088 | A1 | 7/2020 | White et al. |
| 2020/0262060 | A1 | 8/2020 | Hosek et al. |
| 2020/0262660 | A1 | 8/2020 | Hosek et al. |
| 2020/0381276 | A1 | 12/2020 | Yedla et al. |
| 2021/0024929 | A1 | 1/2021 | Yokota et al. |
| 2021/0249291 | A1 | 8/2021 | Raatz et al. |
| 2021/0265188 | A1 | 8/2021 | Moura et al. |
| 2021/0296150 | A1 | 9/2021 | Berger et al. |
| 2021/0328146 | A1 | 10/2021 | Heymanns et al. |
| 2021/0341555 | A1* | 11/2021 | Theuss ................ G01R 33/091 |
| 2021/0354934 | A1 | 11/2021 | Aust et al. |
| 2022/0003718 | A1 | 1/2022 | Watanabe |
| 2022/0013383 | A1 | 1/2022 | Savandaiah et al. |
| 2022/0037181 | A1 | 2/2022 | Hatano et al. |
| 2022/0130700 | A1 | 4/2022 | Newman et al. |
| 2022/0208426 | A1 | 6/2022 | Aust et al. |
| 2022/0293451 | A1 | 9/2022 | Sulyman et al. |
| 2022/0293452 | A1 | 9/2022 | Sulyman et al. |
| 2022/0336258 | A1 | 10/2022 | Srivastava et al. |
| 2022/0393618 | A1 | 12/2022 | Aust et al. |
| 2022/0415635 | A1 | 12/2022 | Yedla et al. |
| 2022/0415687 | A1 | 12/2022 | Hatano et al. |
| 2022/0415688 | A1 | 12/2022 | Hatano et al. |
| 2023/0048878 | A1* | 2/2023 | Schuderer ............ H01L 23/315 |
| 2023/0132174 | A1 | 4/2023 | Thanu et al. |

FOREIGN PATENT DOCUMENTS

| | | | | |
|---|---|---|---|---|
| DE | 102018006259 | A1 | | 12/2019 |
| EP | 1681261 | A1 | | 7/2006 |
| JP | 62121134 | A | | 6/1987 |
| JP | H06324297 | A | | 11/1994 |
| JP | 2003207303 | A | | 7/2003 |
| JP | 2013242301 | A | * | 12/2013 |
| KR | 10-20210081597 | A | | 7/2021 |
| KR | 20220099611 | A | | 7/2022 |
| TW | 202141675 | A | | 11/2021 |
| WO | 2008077048 | A2 | | 6/2008 |
| WO | 2011102410 | A1 | | 8/2011 |
| WO | 2015007385 | A1 | | 1/2015 |
| WO | 2015043712 | A1 | | 4/2015 |
| WO | 2015140155 | A1 | | 9/2015 |
| WO | 2015158725 | A1 | | 10/2015 |
| WO | 2015162177 | A1 | | 10/2015 |
| WO | 2015189263 | A1 | | 12/2015 |
| WO | 2016162288 | A1 | | 10/2016 |
| WO | 2019037858 | A1 | | 2/2019 |
| WO | 2019052657 | A1 | | 3/2019 |
| WO | 2019081044 | A1 | | 5/2019 |
| WO | 2019145035 | A1 | | 8/2019 |
| WO | 2019238416 | A1 | | 12/2019 |
| WO | 2020001750 | A1 | | 1/2020 |
| WO | 2020126040 | A1 | | 6/2020 |
| WO | 2020192911 | A1 | | 10/2020 |
| WO | 2021106796 | A1 | | 6/2021 |
| WO | 2021106799 | A1 | | 6/2021 |
| WO | 2021223843 | A1 | | 11/2021 |
| WO | 2022044834 | A1 | | 3/2022 |

OTHER PUBLICATIONS

U.S. Appl. No. 18/141,909, filed May 1, 2023.
U.S. Appl. No. 18/141,914, filed May 1, 2023.
U.S. Appl. No. 18/141,920, filed May 1, 2023.
U.S. Appl. No. 18/141,926, filed May 1, 2023.
U.S. Appl. No. 18/141,931, filed May 1, 2023.
International Search Report and Written Opinion in related application PCT/US2023/035709 dated Feb. 5, 2024.
International Search Report/ Written Opinion issued to PCT/US2023/079455 on Mar. 6, 2024.
Yu et al.; Controller design and implementation of six-degree-of-freedom magnetically levitated positioning system with high precision; Proc. IMechE vol. 222 Part I: J. Systems and Control Engineering; 12 pages.
Zhu et al.; Design and Control of a Six Degrees-of-Freedom Magnetically Levitated Positioning System; IFAC PapersOnLine 49-21 (2016) pp. 127-132.
U.S. Appl. No. 18/607,043, filed Mar. 15, 2024.
U.S. Appl. No. 18/517,404, filed Nov. 22, 2023.

(56) References Cited

OTHER PUBLICATIONS

U.S. Appl. No. 18/377,572, filed Oct. 6, 2023.
U.S. Appl. No. 18/433,993, filed Feb. 6, 2024.
U.S. Appl. No. 18/417,510, filed Jan. 19, 2024.
U.S. Appl. No. 29/904,232, filed Oct. 24, 2023.
U.S. Appl. No. 18/241,840, filed Sep. 1, 2023.
Temposonics; Sensor Selector Guide; Retrieved from the Internet at: < https://www.temposonics.com/docs/temposonicslibraries/literature/sensor_selector_guide_industrial_551814_en.pdf?sfvrsn=5fde8874_12>; 21 pages; Aug. 2023.
Linear Motion Tips; How do Magnettostrictive sensors work?; Retrieved from the Internet at: <https://www.linearmotiontips.com/how-do-magnetostrictive-sensors-work/> 9 Pages; Retrieved from the Internet on Mar. 18, 2026.

* cited by examiner

MAGNETIC SENSOR ASSEMBLY

BACKGROUND

Field

Embodiments of the present disclosure generally relate to a magnetic sensor for detecting a position of a magnetically levitated carrier.

Description of the Related Art

Semiconductor devices are typically formed on semiconductor substrates using processing systems which include several process chambers, where each process chamber is used to complete one or more of the various steps (e.g., depositions) to form the semiconductor devices (e.g., a memory chip). Processing systems may use substrate transfer systems to move substrates between each of the process chambers. The process chambers and the substrate transfer system of the processing system may each be held at vacuum during processing. Substrate transfer systems may utilize a magnetically levitated carrier to move the substrates through and between each of the process chambers. However, precise, reliable, and smooth transportation of the carriers into and out of each of the process chambers during the various steps used to form semiconductor devices may be challenging. Conventional magnetic sensors generate magnetic fields that interfere with the ability of the substrate transfer system to levitate and convey the carrier.

Accordingly, there exists in the art a need for an improved magnetic sensor to detect a position of a magnetically levitated carrier without adversely impacting the ability of the substrate transfer system to levitate and convey substrates disposed within the carrier.

SUMMARY

In one embodiment, a magnetic sensor comprises a base, at least one magnet, a first sensor element, and a second sensor element. The base including a first side and a second side. The at least one magnet disposed over the first side of the base, the at least one magnet generating magnetic flux. The first sensor element and the second sensor element being disposed over the second side, wherein the first sensor element and second sensor element are configured to measure magnetic flux density, and the magnetic flux generated by the at least one magnet is configured to pass through the first sensor element in a first direction and pass through the second sensor element in a second direction that is opposite to the first direction.

In one embodiments, a magnetic levitation actuator assembly includes a linear stator and a magnetic sensor. The magnetic sensor being positioned adjacent to the linear stator. The magnetic sensor comprises at least one magnet, a base, a first sensor element, and a second sensor element. The at least one magnet disposed on a first side of a base, the at least one magnet generating a magnetic flux. The first sensor element and the second sensor element being disposed on a second side of the base. The first sensor element and second sensor element are configured to measure magnetic flux density. The magnetic flux generated by the at least one magnet is configured to pass through the first sensor element in a first direction and pass through the second sensor element in a second direction that is opposite to the first direction.

In one embodiment, a method of controlling a carrier includes actuating linear stators to levitate a carrier underneath a membrane and a sensor, the sensor including a magnet disposed on a first side of a base and a first sensor element and a second sensor element disposed on a second side of the base. The method further includes determining a distance between the membrane and the carrier levitated below the membrane. Determining the distance includes detecting a magnetic flux density using the first sensor element and the second sensor element, wherein the first sensor element and second sensor element detect magnetic flux density in the horizontal direction. Determining the distance further includes generating a voltage signal based on the detected magnetic flux density. Determining further includes inputting the voltage signal and outputting the distance that is indexed to the voltage signal.

In one embodiments, a magnetic sensor includes a sensor housing, a magnet, a printed circuit board assembly, a first sensor element, and a second sensor element. The sensor housing including a pocket and a magnet opening. The magnet being disposed in the magnet opening. The printed circuit board assembly being disposed in the pocket, the printed circuit board assembly including a first portion and a second portion. The first sensor element and the second sensor element being disposed on the second portion, wherein the first sensor element and second sensor element are configured to measure magnetic flux density, and the magnetic flux generated by the magnet is configured to pass through the first sensor element in a first direction and pass through the second sensor element in a second direction that is opposite to the first direction.

In one embodiment, a magnetic sensor comprises a magnet generating a magnetic field, a housing, a printed circuit board assembly, a first sensor element, and a second sensor element. The sensor housing includes a first side, a second side, a pocket, and a magnet housing portion. The pocket includes a first pocket portion and a second pocket portion, wherein the first pocket portion is formed in the first side, the first pocket portion being defined by an outer surface of the first side, and the second pocket portion of the pocket is formed in the second side, and the second pocket portion including an opening in the second side. The magnet housing portion at least partially defined by the outer surface of the first side that defines the first pocket portion, the magnet housing portion including a magnet opening, and wherein the magnet is disposed in the magnet opening. The printed circuit board assembly disposed in the pocket, the printed circuit board assembly including a first PCB portion and a second PCB portion. The first sensor element and the second sensor element being disposed on the second PCB portion and disposed in the second pocket portion, wherein the first sensor element and second sensor element are configured to measure magnetic flux density of the magnetic field.

In one embodiment, an assembly for a substrate station comprises a linear stator and a magnetic sensor positioned adjacent to the linear stator. The magnetic sensor comprises a sensor housing, a permanent magnet, a printed circuit board assembly, a first sensor element, and a second sensor element. The sensor housing including a pocket and a magnet opening. The permanent magnet being disposed in the magnet opening. The printed circuit board assembly being disposed in the pocket, the printed circuit board assembly including a first portion and a second portion. The first sensor element and the second sensor element being disposed on the second portion, wherein the first sensor element and second sensor element are configured to measure magnetic flux density, and the magnetic flux generated by the magnet is configured to pass through the first sensor element in a first direction and pass through the second sensor element in a second direction that is opposite to the first direction.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to magnetic sensors that are compatible with a substrate transfer systems, including the use of one or more magnetic sensors to detect the position of a carrier configured to support and transfer objects. In some embodiments, the magnetic sensors detect the position of the carrier through a solid membrane that is disposed between the carrier and the magnetic sensor. The magnetic sensor may have one or more magnets such that a useable magnetic field generated by the magnet passes through one or more magnetic field sensor elements of the magnetic sensor and the carrier. Additionally, the one or magnets may have a strength strong enough to robustly measure the position of the carrier but weak enough to avoid an attraction force substantially interfering with the levitation and conveyance of the carrier by one or more magnetic levitation assemblies.

Figure 1:
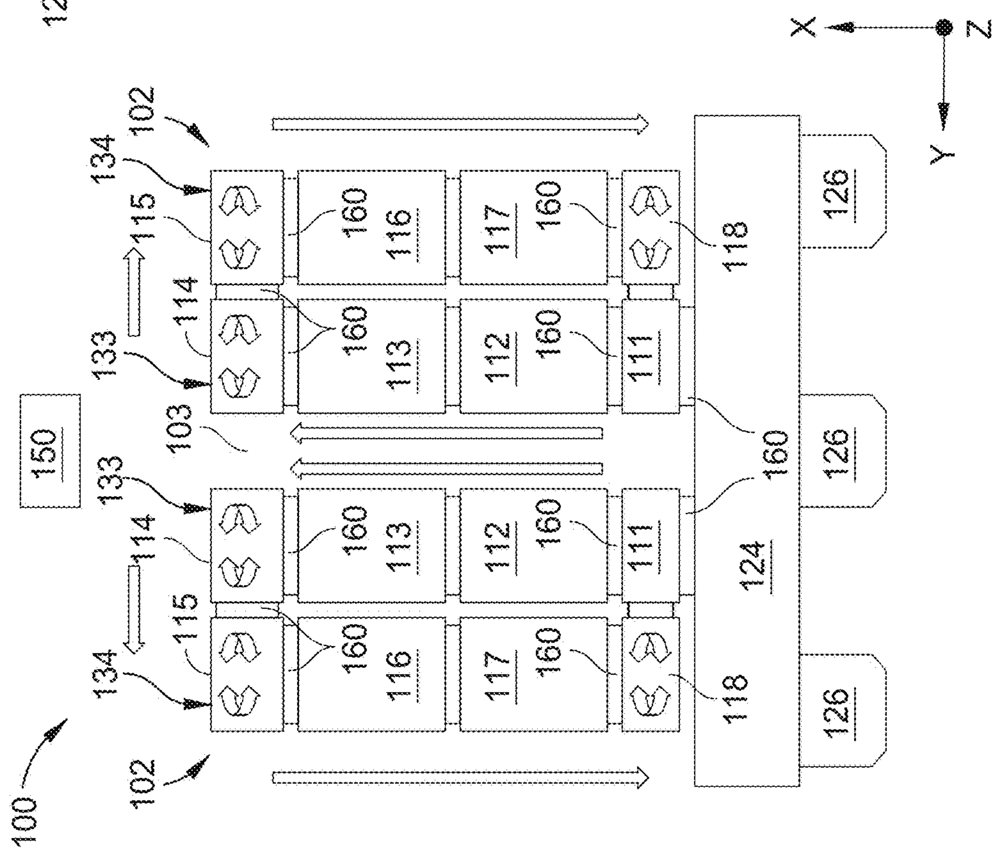
FIG. 1 illustrates a top schematic view of an example substrate processing system, in which embodiments of the present disclosure may be implemented.

FIG. 1 illustrates a top schematic view of an example substrate processing system 100, in which embodiments of the present disclosure may be implemented. The substrate processing system 100 includes a controller 150 and one or more processing lines 102.

The one or more processing lines 102 each include a plurality of stations, as illustrated in FIG. 1. In one example, the processing line 102 illustrated on the right side of FIG. 1 includes at least four process stations 112, 113, 116, and 117, the processing line 102 illustrated on the left side of FIG. 1 includes at least four process stations 112, 113, 116, and 117. However, process stations 111, 114, and 115 may also be configured to perform one or more substrate processing processes. Each processing line 102 may include a magnetic transportation system (not shown) that include a plurality of individual magnetic levitation assemblies disposed within the stations 111-118 that are configured to convey an object 140 (FIG. 3) disposed on a carrier 130 (FIGS. 2A-2B, and exemplary carrier 300 shown in FIG. 3) through the processing line 102. Each processing line 102 may be independent of other processing lines 102. The processing lines 102 may be physically separated by one another by a gap 103. The gap 103 may be sized such that a technician may walk between each processing line 102 to service the one or more stations 111-118.

Each processing line 102 may include a plurality of slit valves 160 to selectively isolate each station 111-118. The slit valves 160 may be selectively opened and closed to allow a clear path for the travel of the carrier 130, to selectively isolate the stations 111-118 from one another, and to facilitate the pressurization or depressurization of the stations 111-118.

The substrate processing system 100 may be used to process multiple substrates in each processing line 102 to produce a desired fabricated substrate. In some cases, the substrate processing system 100 may include a plurality of physical vapor deposition (PVD) process chambers. For example, the first station 111 may be a first load lock station, the second station 112 may be a degas station, the third station 113 may be a pre-clean station, the fourth station 114 may be a routing station, the fifth station 115 may be a routing station, the sixth station 116 may be a PVD tantalum nitride deposition station, the seventh station 117 may be a PVD copper deposition station, and the eighth station 118 may be a routing station that also serves as a buffer station. An object 140 (e.g., substrate) may be transferred and processed within each process station 112-113 and 116-117. The pressure within each station 111-118 may decrease from station to station. For example, the pressure within the seventh station 117 may be lower than the pressure within the other stations (e.g., stations 111-116 and 118).

The first station 111 (e.g., load lock station) may have a magnetic levitation assembly 120 (shown in FIG. 2A), which includes one or more magnetic levitation actuator assemblies 120A that include a plurality of linear stators 230 (FIG. 2B) and a plurality of sensors 270. Each magnetic levitation actuator assembly 120A may include the plurality of linear stators 230 arranged in a linear array (e.g., row) and the plurality of sensors 270 arranged in a linear array adjacent to the linear array of linear stators 230. The carrier 130 is conveyed along the linear array of linear stators 230. As will be discussed further below, the stations 111-118 will each typically include two or more magnetic levitation actuator assemblies 120A that are spaced apart within each of the stations 111-118 to support the carrier 130 as the carrier 130 is transferred through the station. The stations 112-113 and 116-117 (e.g., process stations) may each have a magnetic levitation assembly 120. The fourth station 114, fifth station 115, and eighth station 118 (e.g., routing stations) may each have a magnetic levitation assembly 120. The fifth station 115 may also include a plurality of shutter disks to be placed on a carrier 130 without the object 140. The shutter disks are used to receive deposition material when needed in the place of the object 140 to clean processing equipment, such as cleaning buildup found on a PVD target disposed within the PVD deposition process stations (e.g., stations 116-117).

The magnetic levitation assembly 120 of the first station 111 and the magnetic levitation assembly 120 of the eighth station 118 may cooperate to change the transfer direction (e.g., X-direction to Y-direction) of the carrier 130 within the substrate processing system 100. Additionally, the magnetic levitation assembly 120 of the fourth station 114 and the magnetic levitation assembly 120 of the fifth station 115 may cooperate to change the transfer direction of travel of the carrier 130.

FIGS. 1, 2A, 2B, 2C, and 3-7 include an X-Y-Z coordinate system to illustrate the transfer directions of the carrier 130 and object 140 through the substrate processing system 100, as well as the orientation of the carrier (e.g., carrier 130, 300). The arrows illustrate the direction that one or more carriers 130 circulate within the processing line 102. During an example processing operation, the carrier 130 receives an object 140 (see FIG. 3) entering the first station 111 in the X-direction from one or more front opening unified pods (FOUPS) 126 of a factory interface 124. The carrier 130 is then conveyed to the second station 112 in the X-direction. The first station 111 also receives the carrier 130 from the eighth station 118 in the Y-direction. After the carrier 130 is conveyed into the second station 112, the carrier 130 is conveyed to the fourth station 114 through the third station 113 in the X-direction. The carrier 130 is then conveyed from the fourth station 114 to the fifth station 115 in the Y-direction. The carrier 130 is then conveyed from the fifth station 115 to the eighth station 118 in the negative X-direction through the stations 116-117. The carrier 130 is then conveyed in the Y-direction back into the first station 111. The now fabricated object 140 is transferred back to the FOUP 126. Another object 140 may then be placed onto the carrier 130 in the first station 111 for another processing operation. A shutter disk may be conveyed on a carrier 130 from the fifth station 115 to the first station 111 in a similar manner as the object 140.

In some embodiments of the substrate processing system 100, the processing line 102 has a non-deposition portion 133 and a deposition portion 134. The non-deposition portion 133 may include a linear arrangement of stations, such as the first station 111, the second station 112, the third station 113, and the fourth station 114, that do not subject the object 140 to a process that deposits a layer on the object 140. After the object 140 passes through the non-deposition portion 133, the object 140 is conveyed into the deposition portion 134 that may be a linear arrangement of stations, such as the fifth station 115, the sixth station 116, the seventh station 117, and the eight station 118, that includes at least one station that deposits at least one layer the object. For example, the non-deposition portion 133 includes the first station 111 that is a first load lock, the second station 112 that is a degas station, the third station 113 that is a pre-clean station, and the fourth station 114 that is a routing station. The deposition portion 134 includes the fifth station 115 that is a routing station, the sixth station 116 that is a tantalum nitride deposition station, the seventh station 117 that is a copper deposition station, and the eighth station 118 that is a routing station that also serves as a buffer station.

Figure 2A:
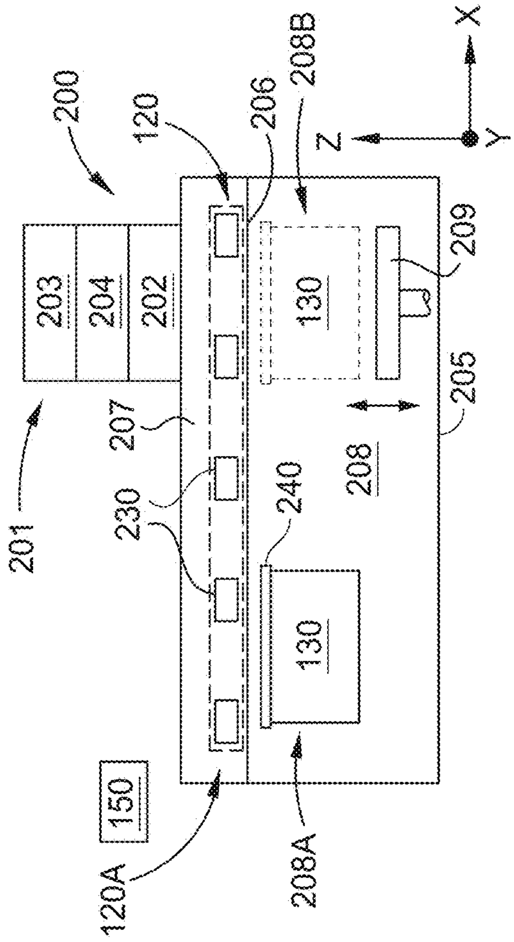
FIG. 2A illustrates a side view of a portion of an example station of the substrate processing system of FIG. 1, in which embodiments of the present disclosure may be implemented.
Figure 2B:
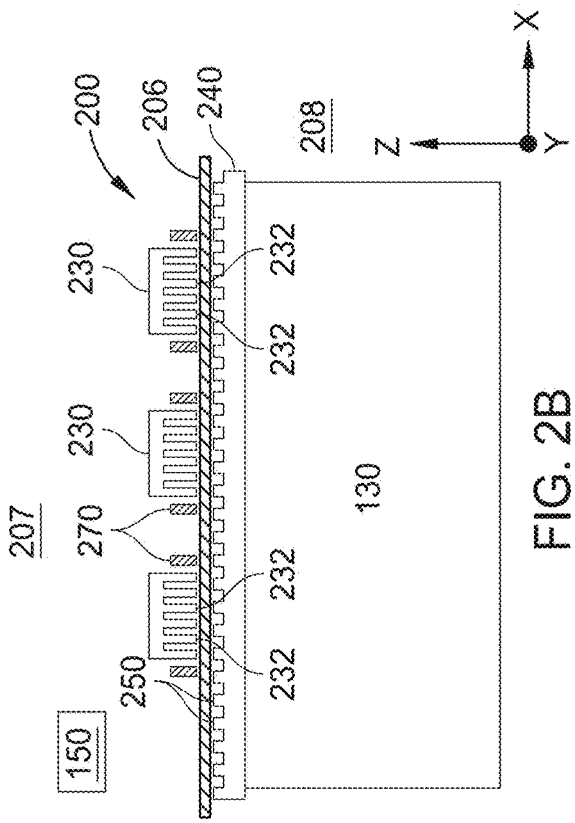
FIG. 2B illustrates a side view of a portion of an example station of the substrate processing system of FIG. 1, in which embodiments of the present disclosure may be implemented.

FIG. 2A and FIG. 2B each illustrate side views of a portion 200 of an example process station (e.g., stations 112-113 and 116-117) of the substrate processing system 100 of FIG. 1, in which embodiments of the present disclosure may be implemented. The example process station, which may be the process station 112-113, 116-117 described above, may be referred to herein as simply the process station 205 for clarity. The process station 205 may be configured for contactless transportation of the carrier 130. The process station 205 may include a process chamber 201 that is maintained at a vacuum pressure, such that a processing region 204 of the process chamber 201 is at a pressure that is less than 760 Torr, or even at a pressure between 1 milliTorr (mTorr) and 500 Torr. The process station 205 may be configured for contactless transportation of the carrier 130 in a vacuum chamber (see second region 208) disposed below the process chamber.

The process station 205 includes a membrane 206 (FIGS. 2B-2C) disposed between the carrier 130 and the magnetic levitation assembly 120. The pressure may be different on opposing sides of the membrane 206. For example, the membrane 206 may be a barrier that isolates a first region 207 of the process station 205 that includes the magnetic levitation assembly 120 from a second region 208 (e.g., vacuum chamber, transport region) where the carrier 130 is located. The first region 207 may be at atmospheric pressure while the second region 208 may be at a vacuum pressure.

The membrane 206 may be made from a material selected from a group comprising transition metals (e.g., iron, nickel, cobalt) and their alloys, and alloys of rare-earth metals. In some embodiments, the membrane 206 is formed from a non-ferromagnetic material, such as some found in metallic and ceramic materials. In one example, the membrane 206 may be formed from a stainless steel, such as a non-ferromagnetic stainless steel (e.g., 301, T304, 304, 316). In some embodiments, the membrane is formed from a titanium alloy. In another example, the membrane is formed from a ceramic material, such e.g., alumina, quartz, zirconia, etc. Thus, the membrane 206 may be made of a non-transparent material in some embodiments that blocks the line of sight between the sensor 270 and the carrier 130.

The carrier 130 may be configured to carry one or more objects 140. For example, the carrier 130 may be a substrate carrier, a shutter disk carrier or a mask carrier. The carrier 130 may also be configured to transport process kit component parts. The carrier 130 may be transported in the X-direction or negative X-direction, as illustrated in FIG.

2A. The carrier 130 may also be transported in the Y-direction or negative Y-direction, as described above.

The carrier 130 includes one or more a magnetic levitation elements 240 that allow the carrier 130 to be levitated and transported through the process station 205. The magnetic levitation element 240 may be a track in the X-direction or the Y-direction. The magnetic levitation element 240 may be a substantially straight magnetic levitation element 240, or may at least include one or more straight portions that allow the carrier 130 to be contactlessly transported through the substrate processing system 100. The magnetic levitation element 240 may define a transportation direction (or transport direction), along which the carrier 130 is contactlessly transported. In one example, as illustrated in FIG. 2A, the carrier 130, which includes one or more magnetic levitation elements 240, is transferred through the process station 205, and to and from other adjacent process stations 205 (not shown), by magnetic levitation, without the carrier 130 contacting the walls or components within the process station 205.

As illustrated in FIG. 2A, the process station 205 includes a magnetic levitation assembly 120 that includes a plurality of magnetic levitation actuator assemblies 120A. The magnetic levitation actuator assemblies 120A interact with a corresponding magnetic levitation element 240 through the membrane 206. The magnetic levitation actuator assemblies 120A each include a plurality of linear stators 230. For example, a magnetic levitation actuator assembly 120A may include two or more, three or more, five or more, or 10 or more linear stators 230, depending on the desired length of the magnetic levitation elements 240, which is often referred to herein as a magnetic levitation element 240. Alternatively, the magnetic levitation actuator assemblies 120A of the magnetic levitation assembly 120 may include one elongated linear stator 230 extending along the entire length of a magnetic levitation element 240. The number of linear stators 230 shown in FIGS. 2A and 2B are examples, and a greater or lesser number of linear stators 230 may be used.

The linear stator 230 may be arranged to guide a corresponding magnetic levitation element 240 of the carrier 130 underneath. For example, a plurality of linear stators 230 may be disposed one after the other in a row, such as shown in FIG. 2A, extending in the X and/or Y-direction. In some embodiments, the one or more linear stators 230 are configured to remain stationary during contactless transportation of the carrier 130 along the magnetic levitation element 240 since the one or more linear stators 230 are coupled to a wall (e.g., top wall or side wall) of the process station 205.

The one or more linear stators 230 may include a plurality of stator poles 232, such as 2, 4, 6, 8 or more stator poles 232, as illustrated in FIG. 2B. The number of stator poles 232 shown in FIGS. 2A and 2B are examples, and a greater or lesser number of stator poles 232 may be used. The stator poles 232 may be protrusions, or teeth, that may project towards the carrier 130 and/or towards a magnetic levitation element 240 attached to the carrier 130. The plurality of stator poles 232 may define at least one comb structure. In some embodiments, a linear stator 230 may include two comb structures, each having a plurality of stator poles 232.

The magnetic levitation assembly 120, which includes the one or more linear stators 230, and the stator poles 232, may include, or be made of, a magnetic material, more specifically a ferromagnetic material. The magnetic material may be a non-permanent, or soft, magnetic material. The magnetic material may be a metal, such as electrical steel, silicon steel, ferritic steel, martensitic steel, or any other soft magnetic material.

The magnetic levitation element(s) 240 of the carrier 130 may include, or be made of, a magnetic material, such as a ferromagnetic material. The magnetic material may be a non-permanent, or soft, magnetic material. The magnetic material may be a metal, such as electrical steel, silicon steel, ferritic steel, martensitic steel, or any other soft magnetic material.

In some embodiments, as shown in FIG. 2A, the carrier 130 may be levitated and contactlessly transported in the X or Y-direction through the substrate processing system 100, for example when the carrier 130 is a substrate carrier for a large area substrate or a mask carrier carrying a mask for a large area substrate. The magnetic levitation element 240 is coupled to a portion of the top of the carrier 130, as illustrated. The magnetic levitation assembly 120, or at least a portion thereof, may be disposed above the carrier 130.

The carrier 130 is configured to be levitated and transported along the length of the magnetic levitation assembly 120 by use of the one or more linear stators 230 of the magnetic levitation assembly 120 that remain stationary within the process station 205. During contactless levitation and/or transportation of the carrier 130, the magnetic levitation element 240 faces at least one linear stator 230. The magnetic levitation element 240 may respectively face different linear stators 230 as the carrier 130 is transported along the magnetic levitation element 240.

Figure 2C:
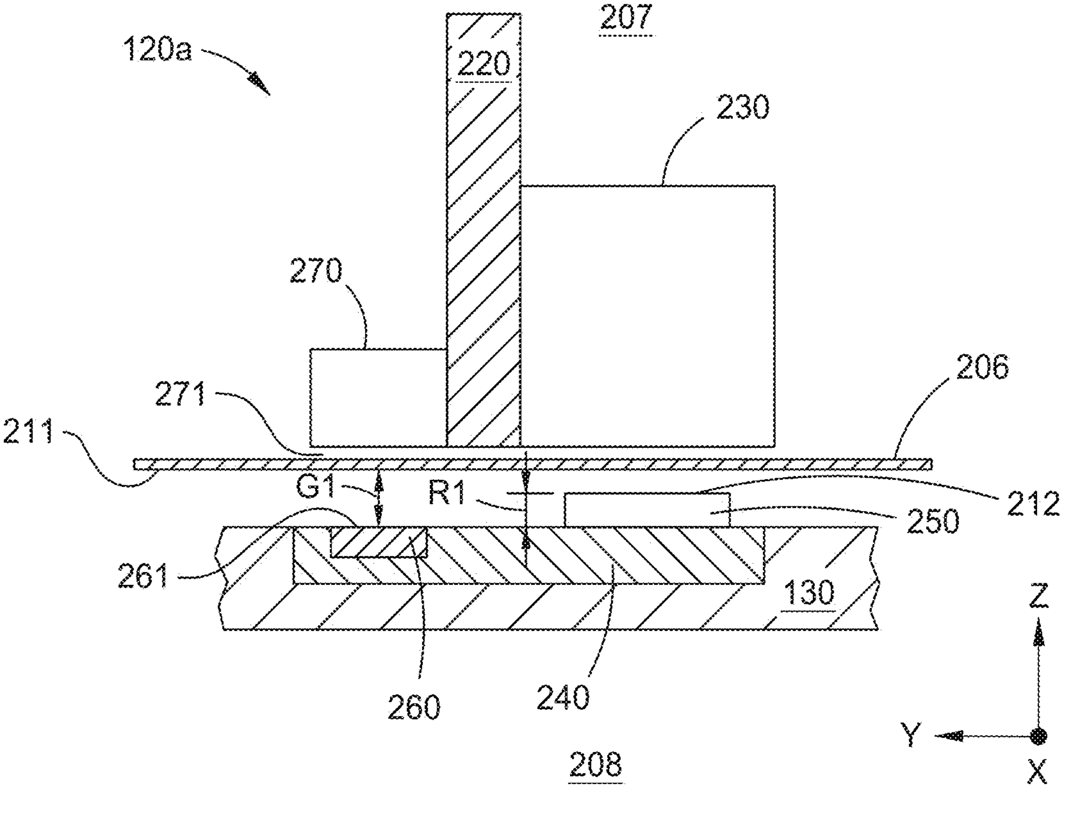
FIG. 2C illustrates a schematic partial cross-sectional view of the portion shown in FIG. 2B, in which embodiments of the present disclosure may be implemented.
Figure 3:
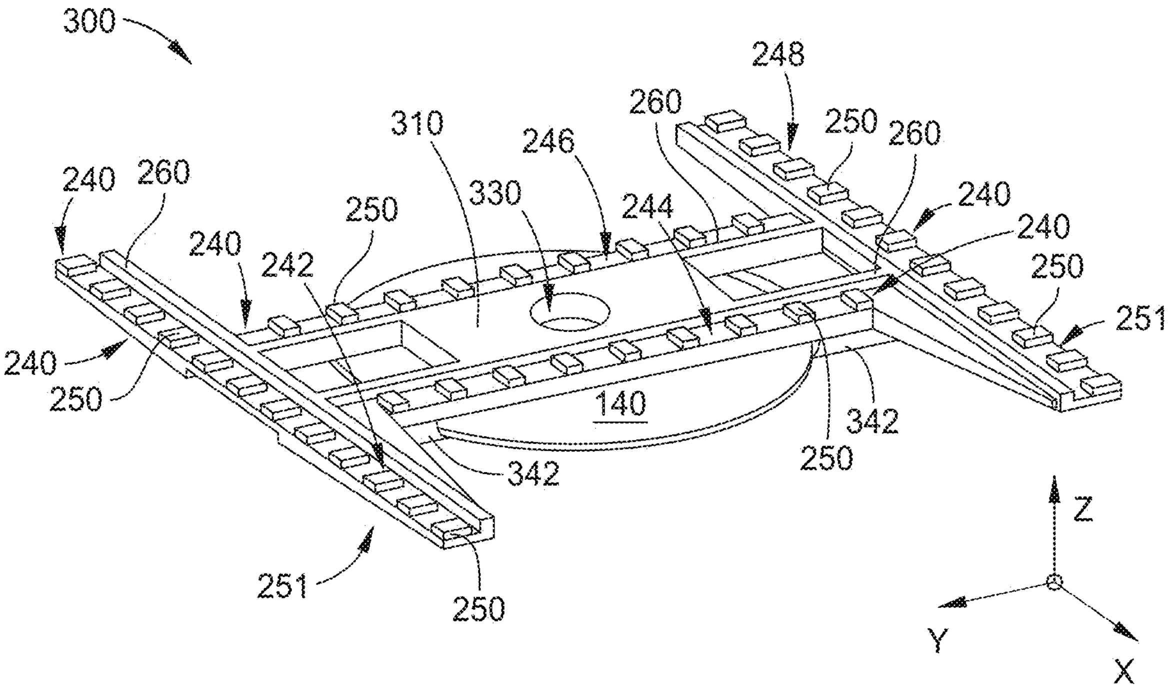
FIG. 3 illustrates an example carrier that includes a base and a magnetic levitation elements, in accordance with embodiments of the present disclosure.

As shown in FIGS. 2B-2C and FIG. 3, the magnetic levitation element 240 may include an array of features 250. Any number of features 250 may be formed within an array of features 251. The features 250 may be protrusions, or teeth, that may project towards at least one linear stator 230 of the opposing magnetic levitation actuator assembly 120A. The raised segments of features 250, which include a magnetic material, may define a comb-like structure as illustrated in FIG. 2B and FIG. 3. Each magnetic levitation element 240 may also include a featureless element 260 adjacent to each array of features 250. The featureless element 260 may span the same or part of the length of the array of features 251. The featureless element 260 may be planar (e.g., a flat surface), which the sensors 270 uses to measure and/or or detect a position of the carrier 130 during contactless levitation and/or transportation. In some embodiments, the featureless element 260 is formed from a ferrous material, such as being a strip of a ferromagnetic material embedded in or attached to the carrier 130. For example, the featureless element 260 may be made of magnetic stainless steel.

A pitch, or spacing, may be provided between adjacent stator poles 232 of a linear stator 230. The term "adjacent stator poles" (and likewise "adjacent features 250") refers to poles of a same linear stator 230 that are adjacent to each other with respect to the direction defined by the magnetic levitation element 240, such as the transportation direction (e.g., X-direction in FIG. 2A). The pitch may be a distance, e.g. a horizontal distance, extending along the magnetic levitation element 240. Likewise, a pitch or spacing may be provided between adjacent features 250 of the magnetic levitation element 240. According to some embodiments, a first pitch between adjacent stator poles 232 of a linear stator 230 may be different from a second pitch between adjacent features 250 of the magnetic levitation element 240. Particularly, a ratio of the first pitch and the second pitch may be non-integer (the first pitch is not an integer multiple of the second pitch and the second pitch is not an integer multiple of the first pitch). The stator poles 232 of the linear stator 230 and the features 250 of the magnetic levitation element 240 may be provided according to a p/q configuration. A p/q configuration means that the distance (in the transportation direction) spanned by p consecutive adjacent stator poles 232 of the linear stator 230 includes a total of q features 250 of the magnetic levitation element 240. In some embodiments, q may be equal to p+1 or to p−1. For example, it may be the case that p=3 and q=2; or p=3 and q=4. In further examples, it may be the case that p=4 and q=3.

According to some embodiments, the one or more linear stators 230 of the magnetic levitation assembly 120 include a set of electromagnets. In light thereof, the one or more linear stators 230 are active magnetic systems that can provide an adjustable, controllable magnetic field. For example, each stator pole 232 of the linear stator 230 may include an electromagnet. The electromagnet may include a respective coil wound around each stator pole 232. Different winding schemes for winding the coils around each stator pole 232 may be provided. For example, the coils may be wound vertically, in that the coils are wound from top to bottom (clockwise) or from bottom to top (counter-clockwise). In some embodiments, the magnetic levitation element 240 may not include an electromagnet. The magnetic levitation element 240 may be a magnetically passive system, wherein the magnetic levitation element 240 is formed from a ferromagnetic material (e.g., permanent magnet, soft ferromagnetic iron), without any electromagnets mounted thereon. In some embodiments, the magnetic levitation element 240, or at least the features 250 formed thereon, include a ferromagnetic material such as a material selected from a group comprising transition metals (e.g., iron, nickel, cobalt) and their alloys, and alloys of rare-earth metals. In one example, the magnetic levitation element 240 includes a ferritic stainless steel, such as a 409, 430 and 439 stainless steel. The magnetic levitation element 240 may also include an electrical steel, silicon steel, martensitic steel, or any other soft magnetic material.

In some embodiments, the magnetic levitation assembly 120 includes two parallel magnetic levitation actuator assemblies 120A running in the X-direction configured to levitate carrier 130 and convey the carrier 130 in either the positive or negative X-direction. The carrier 130 similarly includes two parallel magnetic levitation elements 240 running in the X-direction. Each magnetic levitation element 240 is positioned on the carrier 130 to be underneath the one or more linear stators 230 of a respective magnetic levitation actuator assembly 120A running in the X-direction when the carrier is being conveyed in the X-direction. Additionally, the magnetic levitation assembly 120 may also include two parallel magnetic levitation actuator assemblies 120A running in the Y-direction configured to levitate the carrier 130 and convey the carrier 130 in either the positive or negative Y-direction. The carrier 130 similarly includes two parallel magnetic levitation elements 240 running in the Y-direction. Each magnetic levitation element 240 is positioned on the carrier 130 to be underneath the one or more linear stators 230 of a respective magnetic levitation actuator assembly 120A running in the Y-direction when the carrier 130 is being conveyed in the Y-direction. As the carrier 130 moves in the Y-direction, the magnetic levitation elements 240 running in X-direction move out of alignment with the corresponding magnetic levitation actuator assemblies 120A running in the X-direction. The magnetic levitation actuator assemblies 120A running in the Y-direction are able to maintain levitation as the carrier 130 is moved in the Y-direction. The carrier 130 may be conveyed in the Y-direction to another station (e.g., from the fourth station 114 to the fifth station 115) until the magnetic levitation elements 240 running in the X-direction become aligned with corresponding magnetic levitation actuator assemblies 120A running in the X-direction where the carrier 130 may then be conveyed again in the X-direction.

The process station 205 may include the controller 150. In some embodiments, each process station 205 has its own controller 150 that is connected to a central controller of the substrate processing system 100. The controller 150 may be connected to the set of electromagnets of the linear stators 230 for controlling a current in the electromagnets, and thus the strength of the magnetic field generated by linear stators 230. The current can be increased to increase the attraction force of the set of electromagnets to raise the carrier 130 or decreased to lessen the attraction force of the set of the electromagnets to lower the carrier 130.

The controller 150 as described herein may be a single centralized controller or may be a distributed controller including a plurality of individual control units. The controller 150 may include a central processing unit (CPU), a memory and, for example, support circuits. To facilitate control of the carrier 130, the CPU may be one of any form of general-purpose computer processor that can be used in an industrial setting for controlling various components and sub-processors. The memory may be coupled to the CPU. The memory, or a computer readable medium, may be one or more readily available memory devices such as random-access memory, read only memory, a floppy disk, a hard disk, or any other form of digital storage either local or remote. The support circuits may be coupled to the CPU for supporting the processor in a conventional manner. The circuits in question include cache, power supplies, clock circuits, input/output circuitry and related subsystems, and the like. Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing module process recipe steps being performed within the system.

The one or more linear stators 230 including the electromagnets may, together with the magnetic levitation element 240, form a linear reluctance motor for providing both a contactless levitation and a contactless drive of the carrier 130. A linear reluctance motor is configured for providing a linear motion, or translational motion, of the carrier 130. A linear motor is distinguished from a rotary motor, which provides a rotational motion. The linear reluctance motor of the apparatus according to embodiments described herein provides a linear motion of the carrier 130 along the magnetic levitation assembly 120.

The process station 205 may include one or more sensors 270 for measuring or detecting a position of the carrier 130 during contactless levitation and/or transportation. In some embodiments, a plurality of sensors 270 are arranged in a linear array (e.g., row) adjacent to the linear array of linear stators 230, such as shown in FIG. 2B. For example, sensors 270 may be provided on opposite ends of each linear stator 230. Each sensor 270 is configured to detect the presence of a portion of the carrier 130. Each sensor 270 is also configured to detect a position of the carrier 130, which may include a vertical position and/or a horizontal position of the carrier 130, for example a horizontal position with respect to the transportation direction. The sensor 270 is a magnetic field detection sensor to detect the position of the carrier 130 through the membrane 206. Each sensor 270 may be connected to the controller 150. The sensor 270 may be high-precision sensor, which have a sensor resolution of 100 μm or less, particularly 10 μm or less, that is used to detect the relative position of a portion of the featureless element 260 of the carrier 130 to the sensor 270. Accordingly, the carrier 130 may be positioned vertically and/or horizontally in a target position with high precision. In some embodiments, the sensors 270 are included in the magnetic levitation assemblies 120.

The process station 205 according to embodiments described herein may include one or more sensors 270 for detecting a position of the carrier 130 with respect to a transportation direction of the carrier 130. The controller 150 may be configured to control the reluctance-based drive force in response to a signal provided by the one or more sensors 270 to position the carrier 130 in a target position with respect to the transportation direction. The reluctance-based drive force may be configured to align the carrier 130 along the magnetic levitation element 240 or transport direction. By controlling amplitude and phase angle of an AC signal provided to the coils coupled to the stator poles 232, the dynamic motion characteristics of the magnetic levitation elements 240 and thus the carrier 130, such as the amount of jerk, acceleration, velocity, and finally horizontal position can be adjusted and achieved. The controller 150 may cause the magnetic levitation assembly 120 to adjust the roll, pitch, and/or yaw of the carrier 130 if the sensors 270 detect that the carrier 130 is not level, such as having an unacceptable roll, pitch, and/or yaw. The controller 150 may also cause the magnetic levitation assembly 120 to maintain the carrier 130 in a level orientation as it passes through the second region 208. In some embodiments, three or more sensors 270 located above different portions of the carrier 130 may be used to detect orientation of the carrier 130, such as the roll, pitch, and/or yaw of the carrier 130. The controller 150 may instruct the magnetic levitation assembly 120 to adjust the position of the carrier in the X and/or Y direction if the sensors 270 detect the carrier 130 is out of a desired alignment in the X and/or Y directions. The controller 150 may instruct the magnetic levitation assembly 120 to change the position of the carrier in the Z-direction based on the sensors 270, such as raising and lowering to carrier relative to the membrane 206 to adjust or maintain a gap between the carrier 130 and the membrane 206. For example, the controller may reduce the electrical current to the set of electromagnets of the linear stators 230 to lower the carrier 130 in the Z-direction and may increase the current to the set of electromagnets of the linear stators 230 to raise the carrier 130 in the Z-direction. In some embodiments, the carrier 130 is maintained at a desired position in the Z-direction, such as maintaining the carrier 130 in a level orientation, by adjusting the current to the linear stators 230 in responses to changes in position of the carrier 130 detected by the sensors 270. Thus, the controller 150 may respond to the position of the carrier 130 detected by each sensor 270 to adjust a position of the carrier 130 in the X, Y, and/or Z directions at different positions of the carrier 130 and/or to control the orientation of the carrier 130.

FIG. 2C illustrates a schematic partial cross-sectional view of the portion 200 to illustrate the magnetic levitation actuator assembly 120*a* and carrier 130. The sensors 270 and stators 230 are shown adjacent one another in the Y-direction. The sensor 270 and stator 230 are each attached to a frame member 220 of the magnetic levitation actuator assembly 120*a*. The frame member 220 may extend along the x-direction above the membrane 206. A plurality of stators 230 may be attached to the frame member 220 arranged in a linear array (e.g., row) that is parallel to a linear array of sensors 270 attached to the frame member 220. The frame member 220 may be attached to a wall of the process station 205 in the first region 207 to maintain a fixed distance between the top side of the membrane 206 and the sensor 270 and the stator 230. In some embodiments, sensor 270 is positioned over the membrane 206 or in a recess formed in the membrane 206 such that the sensor 270 is not in contact with the membrane. In other words, a clearance 271 may be present between the membrane 206 and the sensor 270.

The stator 230 is shown in FIG. 2C directly above the one or more features 250 of the magnetic levitation element 240 that are located on the other side of the membrane 206. The sensor 270 is positioned adjacent to the stator 230 and is directly above the featureless element 260. A gap G1 is present between the featureless element 260 and the membrane 206. The featureless element 260 provides a uniform surface for the sensor 270 to detect. The sensor 270, which positioned a fixed distance from the membrane 206, is able to detect changes in the size of the gap G1 (e.g., distance between the membrane 206 and the featureless element 260) through the membrane 206 such that the controller 150 is able to determine the position of the carrier 130 underneath the sensor 270 in the Z-direction. In some embodiments, the sensor 270 may have one or more magnets and one or more magnetic field sensor elements that are able to detect changes in magnetic flux density of a magnetic field generated by the one or more magnets in the sensor 270 as the size of the gap G1 changes. The sensor 270 is able to correlate the detected magnetic flux density, such as a voltage signal produced in response to a detected magnetic flux density, with the size of the gap G1. The magnetic field sensor element may be a Hall Effect element, a giant magnetoresistance (GMR) element, a tunnel magnetoresistance (TMR) element, an anisotropic magnetoresistance (AMR) element, or other suitable magnetic field sensor element. It has been found that GMR and/or TMR sensors produce a signal with less noise and are more sensitive than a Hall Effect sensor element providing higher Signal-to-Noise-Ratio (SNR).

The size of the gap G1 modulates the magnetic field of the one or more magnets of the sensor 270 so that the magnetic flux density detected by the one or more magnetic field sensor element varies based on the size of the gap G1. The configuration of the magnets and relative position of the magnetic field sensor elements to the magnets affects whether increasing the size of the gap G1 increases or decreases the magnetic flux density measured by the magnetic field sensor elements. The sensor 270 may convert the magnetic flux density detected by the sensor elements into a voltage signal that can be used by the controller 150 or processor on the magnetic sensor 270 to determine the size of the gap G1. The dimension of the gap G1 may be determined by correlating the voltage signal generated by the magnetic sensor 270 to the size of the gap G1. For example, controller 150 may have a lookup table stored in the memory that indexes the voltage of the voltage signal to a corresponding size of the gap G1.

The one or more magnetic field sensor elements of sensor 270 may measure one or more components of a magnetic flux density vector, such as the x-component of the magnetic flux density vector, to determine the size of the gap G1. For example, the magnetic field sensor elements may measure the x-component of the magnetic flux density vector to determine the size of the gap G1.

Referring back to FIG. 2C, the underside 211 of the membrane 206 is used as a datum to determine the size of the gap G1. In some embodiments, the membrane 206, however, may deform (e.g., bow, deflect) due to the pressure differential between the first region 207 and second region 208. The amount that the membrane 206 deforms varies due to differences in the thickness of the membrane 206. In some embodiments, the membrane 206 may be composed of a material that is attracted to the magnetic fields generated by the stators 230 and the magnet(s) in the sensors 270. This attraction force generated by the stators 230 and magnet(s) of the sensors 270 may cause the membrane 206 to deform. Additionally, the membrane 206 may deform due to thermal expansion and contraction. Thus, the underside 211 of the membrane 206 may not be a uniform flat surface but instead may vary along the length of the membrane 206.

In some embodiments, the controller 150 compensates for the variations in the position of the underside 211. To compensate for the variations in the position of the underside 211 of the membrane 206, the carrier 130 is periodically raised into engagement with the membrane 206 as the carrier 130 is transported through the second region 208. The controller 150 may use the information obtained by one or more sensors 270 while the carrier 130 is engaged with the membrane 206 to determine the position of the underside 211 of the membrane 206 to calibrate the one or more sensors 270.

For example, the carrier 130 may be lifted to engage the top surface 212 of the features 250 with the membrane 206. The top surface 212 of the features 250 have a fixed position relative to the carrier 130, such as having a fixed position relative to the featureless element 260. The sensors 270 then determines the size of the gap G1 present while the carrier 130 is engaged with the membrane. Each sensor 270 may sense a different size of the gap G1 based on the variation of the deformation of the membrane 206 underneath the specific sensor 270. In some embodiments, the detected gap G1 may then be compared to a reference gap size R1. The reference gap size R1 is the size of the gap G1 that would be present if the underside 211 of the membrane 206 was undeformed. FIG. 2C shows the reference gap size R1 as the differential between the top surface 212 of the feature 250 and the upper surface 261 of the featureless element 260. The controller 150 uses the differential in the detected gap size and the reference gap size R1 to determine the actual position of the underside 211 of the membrane 206 underneath each sensor 270. The controller 150 then calibrates the output of a sensor 270 based on the actual position of the underside 211 of the membrane 206 beneath the sensor 270 to determine the size of the gap G1. In other words, the controller 150 uses the determined position of underside 211 of the membrane 206 as the datum for the sensor 270. The sensor assembly 270 may be calibrated by adjusting the voltage output of each sensor 270 by a factor or offset to account for the position of the underside 211 of the membrane 206.

The controller 150 may be repeatedly engage the carrier 130 with the membrane 206 to calibrate the sensor 270. For example, the controller 150 may cause the stators 230 to lift the carrier 130 into engagement with the membrane 206 after the carrier 130 travels a distance in the transportation direction to allow the controller 150 to calibrate the sensors 270 above the carrier 130. This distance may be equivalent to the length of one stator 230.

In some embodiments, the sensors 270 are calibrated by engaging the carrier 130 with the underside 211 of the membrane 206 to determine the position of each sensor 270 relative to the membrane 206, such as the position relative to the underside 211. Each sensor 270 in the linear array of sensors 270 may vary in position relative to the membrane 206. Additionally, the magnetic field sensor elements in each sensor 270 may vary in position relative to the membrane 206. Engaging the carrier 130 with the membrane 206 allows the controller 150 to determine the variations in position of each sensor 270 and the magnetic field sensor elements. The voltage output of each sensor 270, such as the output of each magnetic field sensor element, may be adjusted based on a factor or offset to account for the variation in position with respect to the membrane 206.

In some embodiments, each sensor 270 is calibrated prior to being placed into the first region 207. For example, each sensor 270 may be placed in an external calibration unit which includes a fixture and a dummy carrier. The fixture allows the sensor 270 to be positioned within the calibration unit above the dummy carrier at the same or substantially the same distance that the sensor 270 will be disposed above the carrier 130 within the first region 207 of the process station 205. The dummy carrier is representative of the carrier 130 in the second region 208 and may have a featureless element 260 positioned underneath the fixture such that the sensor 270 will be above the featureless element 260 during calibration. In some embodiments, the calibration unit includes a dummy membrane between the fixture and the dummy carrier that is representative of the membrane 206. The distance between the sensor 270 mounted to the fixture and the featureless element 260 of the dummy carrier is known. Variations in the components or positioning of the sensor elements of the sensor 270 may cause the voltage output to differ from the expected voltage output. The voltage output of each sensor 270, such as the output of each magnetic field sensor element, may be adjusted based on a factor or offset to account for the variation of the components or positioning of the sensor elements. For example, a different factor is input into the controller 150 for each sensor 270.

Each stator 230 in the array is preferably located at the same vertical position relative to the membrane 206 to facilitate levitating and moving the carrier 130. In some embodiments, the vertical position of the stators 230 relative to the membrane 206 vary. For example, the variation may be due to slight difference in the size of the stators 230 during manufacturing. As another example, positional differences between stators 230 may be the result of the attachment of the stators to the frame member 220. The controller 150 may supply a current to each stator 230 to account for the variation in the vertical position of the stators 230 to maintain the carrier 130 in a level orientation. For example, the controller 150 may supply an increased current to a stator 230 that is farther away from the membrane 206 to generate a similar attraction force to stators 230 positioned closer to the membrane 206.

The sensor 270 is disposed over empty space beneath the membrane 206 when the carrier 130 is not beneath the sensor 270. The sensor 270 may be used to determine if the carrier 130 is disposed underneath the sensor 270, such as using the sensor 270 to track the position of the carrier 130 through the second region 208 of the process station 205. The size of the space beneath the sensor 270 is greatly reduced when the carrier 130 moves underneath the sensor 270 to fill the space and create the gap G1 between the carrier 130 and the membrane 206. Thus, the sensor 270 may detect that the carrier 130 has moved beneath the sensor 270 if the magnetic flux density meets a threshold value, such as a threshold value based on the rate of change in the magnetic flux density that indicates that the carrier 130 has moved underneath the sensor 270. Additionally, the controller 150 may reduce or stop current flowing to a coil within a linear stator 230 if a sensor 270 detects that the carrier 130 is no longer beneath the linear stator 230, such as after the carrier 130 passes underneath the stator 230 as it travels into a different process station. The ability to monitor and control the magnetic fields generated by the stators 230, and in some cases, as discussed further below, the magnetic fields generated by the sensors can be useful to avoid the generated magnetic fields from affecting the processes performed in a process station (e.g., stations 112-113 and 116-117).

For example, the sensor 270 may receive a voltage signal that indicates that the carrier 130 is not located underneath the sensor 270, such as outputting a voltage signal that is outside of a threshold value. The threshold value may be the maximum size of a gap stored in a lookup table in the controller 150. This maximum size of the gap G1 may be the largest dimension of the gap G1 present when the carrier 130 is disposed under the sensor 270. For example, the maximum size of the gap G1 may be the size of the gap G1 present when the carrier 130 is resting on a bottom surface of the process station 205 or engaged with one or more landing rails disposed underneath the carrier 130 within the second region 208. Once the carrier 130 is located underneath, the sensor 270 outputs a voltage signal that is within the range of input voltages of the stored lookup table, indicating that the carrier 130 is underneath the sensor 270.

In some embodiments, the sensor 270 is positioned over a portion of the carrier 130 that has features, such as being positioned over the array of features 250. The position of the carrier 130 in a translation direction, in some embodiments, can be detected by the detection of the passage of or presence of an edge of the features 250 near or relative to the sensor 270. The controller 150 is configured to account for the differential heights of the features 250.

The controller 150 may control the position of the carrier 130 in the Z-direction based on the size of the gap G1 detected by the sensors 270. In some embodiments, the controller 150 may adjust the current to the linear stators to maintain the size of the gap G1. For example, the gap G1 may be maintained at a distance less than 10 mm, such as 9 mm, such as 8 mm, such as 7 mm, such as 6 mm, such as 5 mm, such as 4 mm, such as 3 mm, such as 2 mm, such as 1 mm. In some embodiments, the process station 205 is arranged such that the gap G1 is in either the X-direction or Y-direction rather than the Z-direction. The sensor 270 may be used to control the size of the gap G1 in the X-direction and/or Y-direction.

The controller 150 may maintain the size of the gap G1 by closed loop control. For example, the controller 150 may have a desired distance of the gap G1 as a stored value, such as a gap distance of 5 mm. The controller 150 may use the sensors 270 to determine the size of the gap G1 present between the membrane 206 and the featureless element 260. If the detected size is equal to the stored value, then the controller 150 does not cause the stators 230 to adjust the z-position of the carrier 130. In some embodiments, the controller 150 may increase the current to one or more stators 230 if the gap G1 is greater than the stored value to lift the carrier 130 to adjust the gap G1 to the stored value. Similarly, the controller 150 may decrease the current to one or more stators 230 if the gap G1 is less than the stored value to lower the carrier 130 to adjust the gap G1 to the stored value.

In some embodiments, the controller 150 may also not cause the linear stators 230 to adjust the z-position of the carrier 130 if the detected size is within a threshold range of the stored value. For example, the threshold range may be 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0 mm. In other words, the controller 150 may not adjust the z-position of the carrier 130 if the detected position is within the threshold range, such as being within plus or minus 0.5 mm of 5 mm as an example. If the controller 150 determines that the detected position is outside of the threshold range, then the controller 150 causes the stators 230 to adjust the z-position of the carrier 130 to return the size of the gap G1 to the stored value.

Additionally, the gap size detected by each sensor 270 may differ if the carrier 130 is not level. The controller 150 may use the distance detected by each sensor 270 to adjust the pitch or tilt of the carrier 130 to return the carrier 130 to a level orientation. This process may repeat cyclically during the operation of the process station 205 to maintain the desired size of the gap G1, and thus z-position of the carrier 130.

The process station 205 includes a substrate support 209 disposed below the process chamber 201. The process chamber 201 includes a process kit assembly 202, and a source assembly 203. As shown, the substrate support 209 is disposed below the process kit assembly 202 and source assembly 203. The carrier 130 is shown in a park position, as indicated by the reference sign 208A, within the second region 208. The carrier 130 is moveable to a transfer position 208B (shown in dashed lines and indicated by reference sign 208B) above the substrate support 209.

The substrate support 209 is moveable in the Z-direction within the second region 208 to one or more positions. While the carrier is moving within the process station 205, the substrate support 209 may be positioned in a lower position to allow the carrier 130 to move to through and/or to one or more positions within the second region 208 without contacting the substrate support 209.

The carrier 130 is moved to the transfer position 208B above the substrate support 209 to facilitate the transfer of the object 140 on the carrier 130 to lift pins of the substrate support 209. The carrier 130 is then moved to the park position 208A (e.g., position opposite to the transfer position) after the object 140 is transferred to the lift pins. The carrier 130 is clear from the substrate support 209 when in the park position 208A to allow the substrate support to move vertically from the lower position to a process position with the transferred object 140 disposed thereon.

The substrate support 209 is engaged with the process kit assembly 202 when in the process position. In some embodiments, the process kit assembly 202 includes one or more components to seal against the substrate support 209 when the substrate support 209 is in the process position. For example, the substrate support 209 and process kit assembly 202 may at least partially defined the process region 204 within the process station 205 where the substrate 140 is subjected to a process performed by the source assembly 203. The process region 204, which is defined by surfaces of the substrate 140, the substrate support 209, the process kit assembly 202 and the source assembly 203, is isolated from the second region 208 when the substrate support 209 is in the process position. For example, the source assembly 203 may be configured to deposit a layer via a physical vapor deposition (PVD) process onto the substrate 140. Once the process performed by the source assembly 203 is complete, the substrate support 209 is lowered from the process position to a lower position to allow the carrier 130 to return to the transfer position 208B where the substrate 140 is transferred from the lift pins back onto the carrier 130.

The source assembly 203 may be adapted to perform a physical vapor deposition ("PVD"), chemical vapor deposition ("CVD"), plasma enhanced chemical vapor deposition ("PECVD"), atomic layer deposition ("ALD"), plasma enhanced atomic layer deposition ("PEALD"), etch, lithography, ion implantation, ashing, cleaning, thermal process (e.g., rapid thermal processing, anneal, cool down, thermal management control) degas, and/or other useful substrate processes.

In some embodiments, the membrane 206 may have an opening allowing the substrate support 209 to be raised upward toward the process chamber 201 into engagement with the process kit assembly 202. In some embodiments, the process station 205 includes one or more separate membranes 206 for each magnetic levitation actuator assembly 120A. The process chamber 201 may disposed between separate membranes 206.

FIG. 3 illustrates an example carrier 300 that includes a base 310 and the magnetic levitation elements 240 of FIGS. 2A-2C, in accordance with embodiments of the present disclosure. In some embodiments, the carrier 130 described above may be implemented as the carrier 300. The carrier 300 of FIG. 3 may be similar to the carrier 130 of FIGS. 2A-2C, and everything discussed herein with respect to the carrier 130 may also apply to the carrier 300.

In some embodiments, the magnetic levitation element 240 of the carrier 300 may be coupled to the base 310. The carrier 300 may also include an opening 330 in the base 310. The carrier 300 may further include one or more substrate support members 342 coupled to the base 310 to support the object 140. Although the object 140 is illustrated in FIG. 3 as a substrate, the carrier 300 may also be configured to carry other objects. For example, the carrier may be configured to carry a mask, shutter, process kits parts, or other objects used in semiconductor processing, as described above. The carrier 300 may also be configured to transport shutter or process kits parts.

In some embodiments, the magnetic levitation element 240 may include or be implemented as one or more rails (e.g., rails 242, 244, 246, 248). The rails 242, 244, 246, 248 may each be aligned in a certain direction relative to the base 310. In some cases, the magnetic levitation element 240 of the carrier 300 may include a first rail 242 aligned in a first direction (e.g., the X-direction). The magnetic levitation element 240 may also include a second rail 244 aligned in a second direction (e.g., the Y-direction). The magnetic levitation element 240 may also include a third rail 246 aligned in the Y-direction and is aligned parallel to the second rail 244. The magnetic levitation element 240 may also include a fourth rail 248 aligned in the X-direction, and is aligned parallel to the first rail 242. Although the carrier 300 in FIG. 3 is illustrated as having four rails 242, 244, 246, 248, however, any number of rails may be used in the carrier 300.

The dimensions of the carrier 300 (including the base 310 and the rails 242, 244, 246, 248) may be based on at least one of the size of the stations 111-118, the location of the sensors 270 in the stations 111-118, or the size of the objects (e.g., the object 140) being transported by the carrier 300. The dimensions of the carrier 300 may also be selected to facilitate the stability of the carrier 300 during transportation of the object(s) 140, as well as ensure the stability of the carrier 300 when nothing is transported. The carrier 300 may be also be configured to be large enough to support the object 140 (or multiple objects 140, as described below) and small enough to pass into, through, and out of stations (e.g., stations 111-118) of a substrate processing system (e.g., substrate processing system 100), as described above.

The features 250 may be arranged on the rails 242, 244, 246, 248. In some embodiments, a pitch and/or spacing may be provided between adjacent features 250, as described above. The features 250 may also be arrange side by side. As illustrated in FIG. 3, the array of features 250 of the first rail 242 may be aligned in the X-direction along a surface of the first rail 242, the array of features 250 of the second rail 244 may be aligned in the Y-direction along a surface of the second rail 244, the array of features 250 of the third rail 246 may be aligned in the Y-direction along a surface of the third rail 246, and the array of features 250 of the fourth rail 248 may be aligned in the X-direction along a surface of the fourth rail 248. In some embodiments, the features 250 may be arranged linearly. A gap between each feature may vary between features 250, or may be the same along the rails 242, 244, 246, 248.

In some embodiments, the features 250 of the rails 242, 244, 246, 248 may cover a portion of the top of the carrier 130. The featureless element 260 of the magnetic levitation elements 240 is shown adjacent to the features 250 of each rail 242, 244, 246, 248. The featureless element 260 may be included on the top of one or more of the rails 242, 244, 246, 248 of the carrier 300, and may be implemented as a featureless track that is aligned with the array of features 250. In some embodiments, the magnetic levitation elements 240 may each include an outer portion and an inner portion. In these embodiments, the features 250 may be located on one or more outer portions of the magnetic levitation elements 240 and the featureless element 260 may be located on one or more inner portions of the magnetic levitation elements 240, as illustrated in FIG. 3. In some embodiments, the featureless element 260 may be a featureless portion of a surface of the magnetic levitation element 240 rather than being an element embedded on or attached to the magnetic levitation element 240. In some embodiments, at least a portion of the base 310 may be featureless and may be planar (e.g., substantially flat) and configured to enable the sensors 270 to measure and/or or detect a position of the carrier 300 during contactless levitation and/or transportation. That is, at least a portion of the base 310 may function as the featureless element 260.

The base 310 of the carrier 300 may be formed from a non-magnetic material and vacuum compatible material, such as metal (e.g., aluminum (Al), non-magnetic stainless steel (e.g., 316 SST) or titanium (Ti)). In some embodiments, it is beneficial to select the material from which the carrier 300 is made to include a material that can also withstand high processing temperatures. In one example, the substrate carrier 300 is made from a ceramic material (e.g., alumina, quartz, zirconia, etc.). In some cases, the substrate carrier 300 may be coated with an electrically conductive coating to resolve any charge build-up issues in the substrate carrier 300 during processing within the process station 205. In some embodiments, the rails 242, 244, 246, 248 may include a magnetic material, and the base 310 may not include a magnetic material. By using a different material in the base 310 than the rails 242, 244, 246, 248, the carrier 300 may be configured to be lighter, and/or may be cheaper to manufacture. In some embodiments, the base 310 may be made from the same material as the rails 242, 244, 246, 248.

For example, the base 310 and the rails 242, 244, 246, 248, including the featureless element 260, may be made of magnetic stainless steel.

Figure 4A:
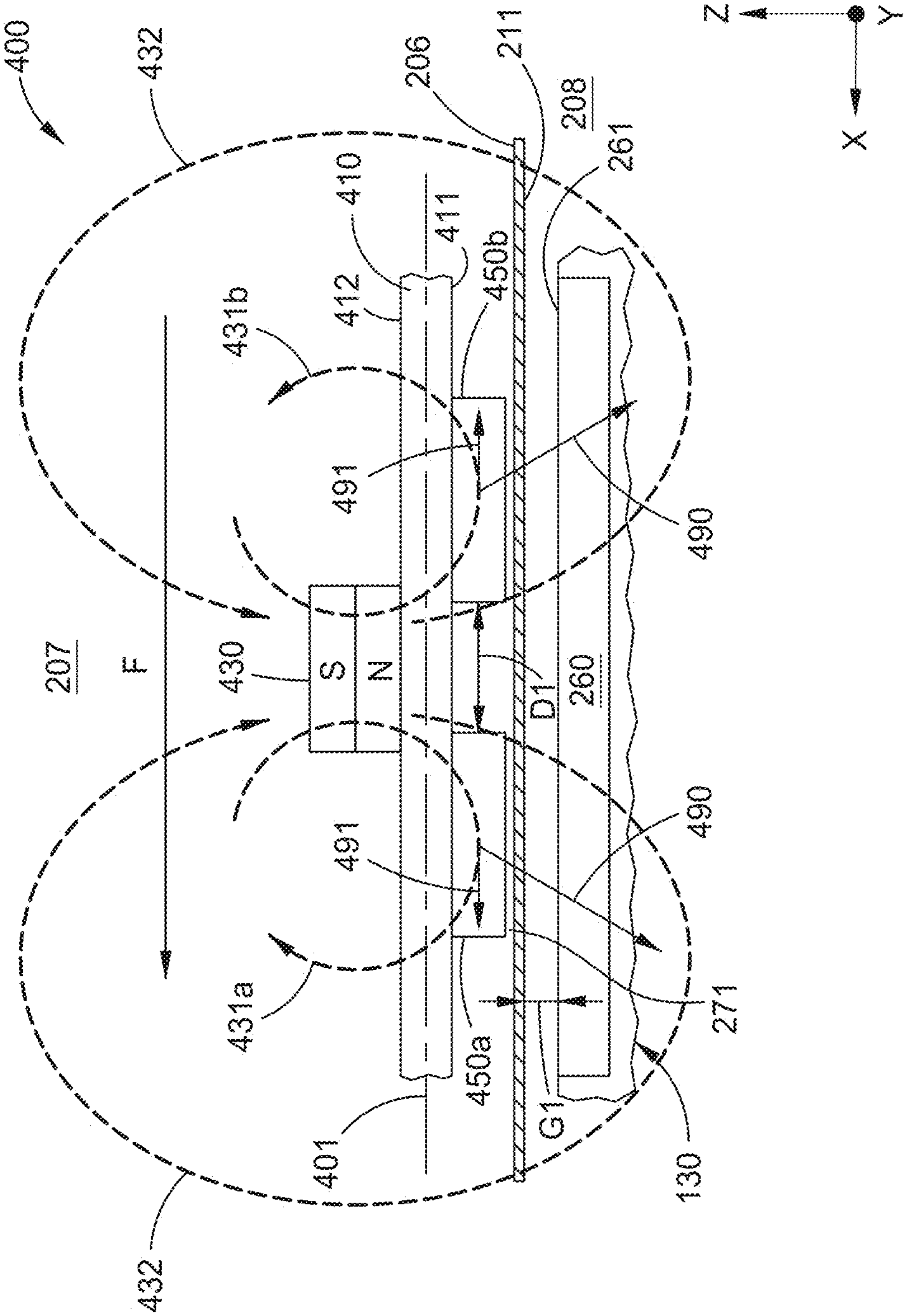
FIG. 4A illustrates a partial cross-sectional view of a portion of an example processing station that includes an exemplary magnetic sensor, in accordance with embodiments of the present disclosure.
Figure 4B:
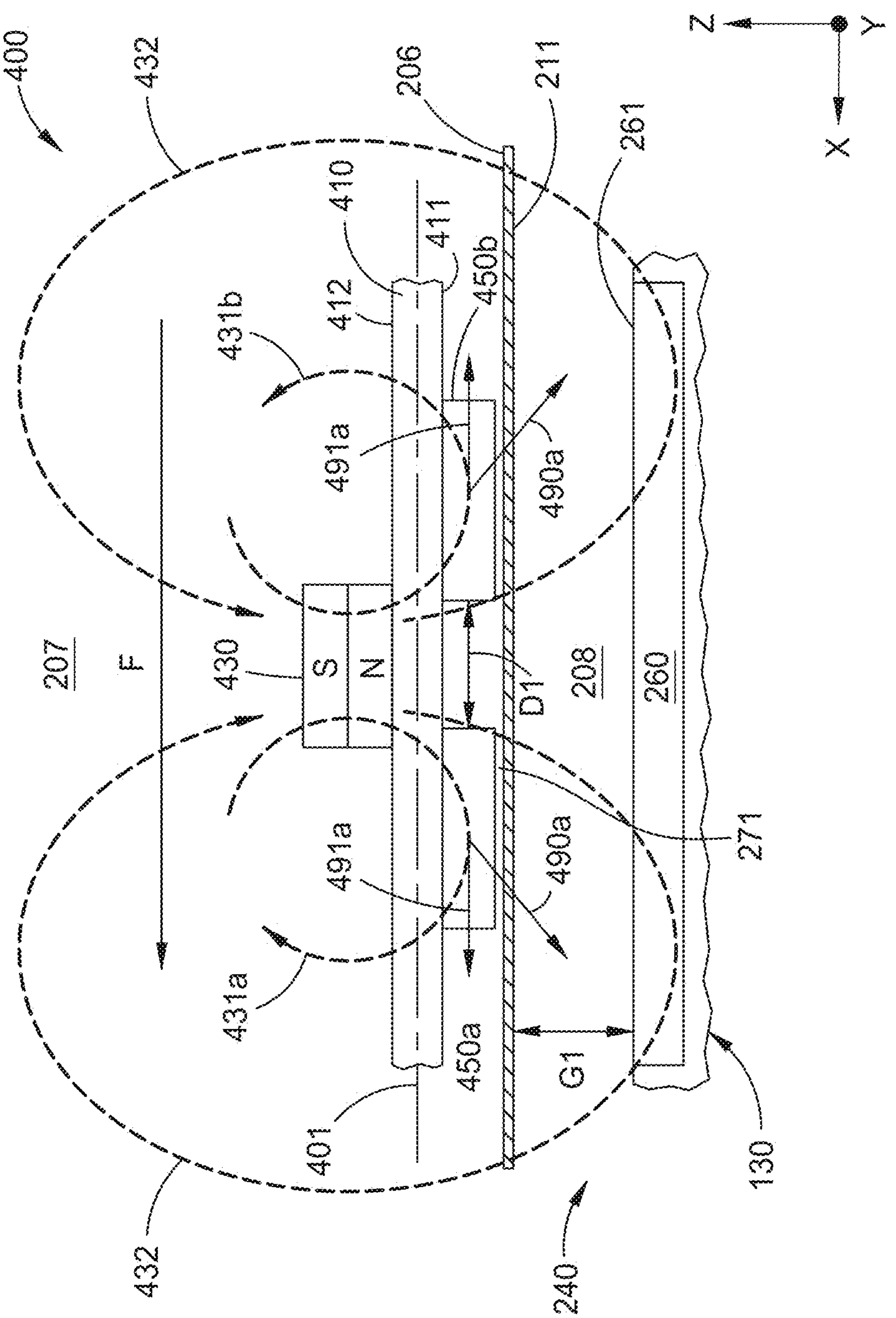
FIG. 4B illustrates a partial cross-sectional view of a portion of an example station showing an exemplary magnetic sensor, in accordance with embodiments of the present disclosure.

FIGS. 4A and 4B are each a partial cross-section of the process station 205 that show a schematic side view of a magnetic sensor 400. The magnetic sensor 270, described herein, may include the sensor 400 to detect the gap G1 between the carrier, such as carrier 130 or 300, and the membrane 206. The magnetic sensor 400 includes a magnet 430, a first sensor element 450*a*, a second sensor element 450*b*, and a magnetic field permeable base 410, or for simplicity of discussion, often referred to herein as a base 410.

The base 410 has a first side 411 and a second side 412. The first and second sensor elements 450*a*, 450*b* are disposed on the first side 411. In some embodiments, the magnet 430 is disposed on the second side 412. In some embodiments, the magnet 430 is spaced apart (e.g., not in contact) from the second side 412 with the base 410 being disposed between the magnet 430 and the first and second sensor elements 450*a*, 450*b*. For example, the magnet 430 may be attached to a sensor housing that the magnetic sensor 400 is disposed within. The magnet 430 is disposed between the first and second sensor elements 450*a*, 450*b*. In some embodiments, the base 410 is a printed circuit board (PCB) with the first and second sensor elements 450*a*, 450*b* being connected to the one or more circuits formed on or within the PCB 410. The PCB 410 may be in communication with the controller 150. For example, the PCB 410 communicates the measurements and/or data obtained by the first and second sensor elements 450*a*, 450*b* to the controller 150 by delivering a measurement signal (e.g., voltage signal) to the controller 150. For example, the controller 150 may receive a voltage reading from the magnetic sensor 400 that is converted into a size of the gap G1, wherein the magnitude of the voltage provided in the signal relates to the size of the gap G1. In some embodiments, the base 410, including embodiments where the base 410 is a PCB, may be formed to include one or more recesses or pockets to at least partially receive the first and second sensor elements 450*a*, 450*b* and the magnet 430. The PCB 410 may be oriented horizontally as shown in FIG. 4A. Using a PCB as the base 410 also decreases manufacturing costs since an automated process can be used to attach the sensor elements 450*a*, 450*b*, and the magnet 430 instead of hand soldering of the components together. In some embodiments, the base 410 may include shaping features that may be attached to or integral with the base 410 to shape a magnetic field 432 emanating from the magnet 430. The shaping features my include structural elements, such as conductive portions of the base, conductive plates, sheet metal, ferromagnetic elements, or ferrite elements, etc., that are able to block and/or guide the shape of the magnetic field 432 generated by the magnet 430.

In some embodiments, the base 410, including embodiments where the base is a PCB, may be formed from, fully coated by, or partially coated by a vacuum compatible material. In some embodiments, the first side 411 is coated with a vacuum compatible material.

In some embodiments, the magnet 430 is a permanent magnet, such as a rare-earth magnet, such as a samarium-cobalt and neodymium-iron-boron magnet. The strength of the magnet 430 may be selected based on the desired amount of magnetic flux that passes through the first and second sensor elements 450*a*, 450*b* and a portion of the membrane 206 and magnetic levitation element 240. The strength of the magnet 430 may be selected based on the maximum distance that the carrier 130 can be located below the membrane 206 within the process station 205 such that the magnetic sensor 400 can sense the carrier 130 at the maximum size of the gap G1.

The strength of the magnet 430 is also selected to avoid adversely affecting the ability of the linear stators 230 to levitate and drive the carrier 130. If the magnet 430 is too strong, then a plurality of magnets 430 in multiple magnetic sensors 400 disposed above the carrier 130 applies a strong attraction force to the magnetic levitation elements 240 that levitates the carrier 130, which impedes the ability of the linear stator 230 to generate a magnetic field to drive the carrier 130 without contacting the membrane 206. For example, the linear stator 230 may only be able to generate a weak drive force to avoid raising the carrier 130 into contact with the membrane 206 due to the attraction of an overly strong magnet 430, causing the carrier 130 to move at low speeds that increase operation time. Thus, a benefit of the magnetic sensor 400 over legacy magnetic sensors is that the magnet 430 has a strength sufficient to allow the first and second sensor elements 450*a,b* to obtain measurements and/or data sufficient to determine the position of the carrier 130 while not applying a significant attraction force to the carrier 130. For example, the magnet 430 may be a Grade N45 neodymium magnet that is cylindrical with a diameter 6 mm and height 10 mm. For example, the magnet 430 may be a Grade N38 neodymium magnet that is a cube with 8 mm edge length.

The magnet 430 is vertically oriented such that the North and South poles extend in the vertical direction (e.g., Z-direction). In other words, the magnetic axis of the magnet 430 is perpendicular or substantially perpendicular to a longitudinal axis 401 of the base 410, and also preferably the surface of the featureless element 260 of a magnetic levitation element 240. At least during operation, the magnet 430 generates the magnetic field 432 shown as arrows that extends across the membrane 206 into the second region 208, and may even pass through the carrier 130. The magnetic field 432 extends from opposing lateral sides of the magnet 430. The magnetic field 432 extending from one lateral side of the magnet 430 circulates in an opposite direction from the field extending from the other lateral side of the magnet 430. This magnetic field 432 includes a first and second usable field portion 431*a*, 431*b* on opposing lateral sides of the magnet 430 as shown by the arrows in FIG. 4A. The first and second usable field portions 431*a*, 431*b* circulate in opposing directions and have the same or roughly the same field strength. The first and second usable field portion 431*a*, 431*b* pass through the first and second sensor elements 450*a*, 450*b*, respectively, above the membrane 206 and pass through the first sensor element 450*a* and second sensor element 450*b* in at least one opposing direction, such as at least a portion of first and second usable field portions 431*a*, 431*b* passing through the first and second sensor elements 450*a*, 450*b* in the +X-direction and –X-directions, respectively.

In some embodiments, the thickness of the base 410 is selected such that the first and second useable field portions 431*a*, 431*b* generated by the magnet 430 pass through the first and second sensor elements 450*a*, 450*b*, respectively. In some embodiments, the base 410 may be a PCB with a spacer material disposed between the magnet 430 and the second side 412 to increase the distance between the magnet 430 and the first and second sensor elements 450*a*, 450*b*.

The first and second sensor elements 450*a*, 450*b* are magnetic field sensor elements configured to measure the magnetic flux density. Changes in the magnetic flux density are used to determine the position of the carrier 130. For example, the first and second sensor elements 450*a*, 450*b* may be configured to convert the magnetic flux density into a voltage signal that is sent to the controller 150. The voltage signal may be correlated to the dimension of the gap G1.

While the first and second sensor elements 450*a*, 450*b* are shown disposed on the first side 411, the sensor elements 450*a*, 450*b* may be disposed on the second side 412 or embedded in the base 410. In some embodiments, the sensor 400 is disposed in second region 208 rather than in first region 207. The base 410 may be a barrier between the second region 208 and another region of the station 205 at an atmospheric pressure. Thus, the first side 411 may experience vacuum conditions while the second side 412 is exposed to atmospheric conditions. The first side 411 may be the datum, similarly to the underside 211 of the membrane 206, to measure the gap G1. In some embodiments, the membrane 206 is omitted but the base 410 is configured to be a barrier between the second region 208 and another region of the station 205 that is at a different pressure, such as atmospheric pressure. The first side 411 may be the datum, similarly to the underside 211 of the membrane 206, to measure the gap G1.

The linear stator 230 generates a magnetic field to levitate and/or drive the carrier 130. Part of this generated magnetic field will become a stray field that interacts with the sensor 400. The horizontal component of the stray field from the linear stator 230 (not shown) positioned on the right side of the sensor 400, shown by arrow labeled F, is weaker than the vertical component of the stray field generated by the linear stator 230. The horizontal component of the stray field F is weaker than the vertical component because, at least in part, the coils (not shown) of the linear stator 230 are substantially vertically wound. In some embodiments, and as shown in FIG. 4A, the first and second sensor elements 450*a*, 450*b* are oriented to measure the magnetic flux density in the horizontal direction (e.g., in the horizontal plane of the X, Y axis). In other words, the first and second sensor elements 450*a*, 450*b* may be used to detect the horizontal component of a magnetic flux density vector, such as the x-component of the generated magnetic fields. Without being bound by theory, orienting the sensor elements 450*a*, 450*b* to measure the magnetic flux density in the horizontal direction minimizes or eliminates the effect of the vertical component of the stray field on the sensor elements 450*a*, 450*b*. The first and second sensor elements 450*a*, 450*b* may be a GMR element or a TMR element. In some embodiments, the first and second sensor elements 450*a*, 450*b* may be a Hall Effect element, an AMR element, or other suitable element. In some embodiments, there is a clearance 271 between the sensor elements 450*a*, 450*b* and the membrane 206 such that the membrane 206 is not in contact with the sensor elements 450*a*, 450*b*. In some embodiments, the first and second sensor elements 450*a* and 450*b* maybe another suitable sensor element, such as a Hall Effect sensor element.

Additionally, the first and second sensor elements 450*a*, 450*b* are separated by a distance D1, such being 10 mm or less than 10 mm apart, such as 9 mm apart, such as 8 mm apart, such as 7 mm apart, such as 6 mm apart, such as 5 mm apart, such as 4 mm apart, such as 3 mm apart, such as 2 mm apart, such as 1 mm apart. In some embodiments, the distance D1 exceeds 10 mm. This distance is small enough that the horizontal stray field F experienced by both the first and second sensor elements 450*a*, 450*b* is roughly the same or is at least at a constant ratio between the two sensor elements 450*a*, 450*b*. This allows the controller 150 to compensate for the effect of the horizontal stray field F since the sensor elements 450*a*, 450*b* experience the horizontal stray field F in the same direction and experience respective useable field portions 431*a*, 431*b* that are circulating in opposing directions.

For example, the horizontal component of the magnetic flux density detected by the first sensor element 450*a* is $B_1$ and the horizontal component of the magnetic flux density detected by the second magnet field sensor element 450*b* is $B_2$. The first sensor element 450*a* experiences the horizontal component of the flux density of the magnetic stray field F ($B_{stray}$) and the horizontal component of the flux density of the first useable field portion 431*a* ($B_{Useable}$) generated by the magnet 430. The second sensor element 450*b* experiences the horizontal component of the flux density of the magnetic stray magnetic field F ($B_{stray}$) and the horizontal component of the flux density of the second useable field portion 431*b* ($B_{Useable}$) which is the same as the first useable field portion 431*a* but in an opposite direction. The horizontal component of the usable field portions 431*a*, 431*b* are shown as x-component 491 of vector 490 in FIG. 4A x-component 491*a* of vector 490*a* in FIG. 4B. The stray field F generated by the adjacently positioned linear stator 230 is substantially in the same direction for each sensor element 450*a*, 450*b* and is assumed to have the same flux density based on the positioning of the two sensor elements 450*a*, 450*b*. Based on a system of equations, the controller can determine a difference in the magnetic flux density ($B_1-B_2$) detected by the first and second sensor elements 450*a*, 450*b* that can be correlated to a size of the gap G1:

$$B_1 = B_{stray} + B_{Useable}$$

$$B_2 = B_{stray} - B_{Useable}$$

$$B_1 - B_2 = 2(B_{Useable})$$

FIG. 4A shows the carrier 130 in a first position in the Z-direction close to the membrane 206. FIG. 4B shows the carrier 130 in a second position in the Z-direction, having moved in the negative Z-direction, such that the carrier 130 is farther away from the membrane 206. Thus, the gap G1 in FIG. 4A is smaller than the gap G1 in FIG. 4B. The sensor elements 450*a*, 450*b* are configured to sense the x-component of a magnetic flux density vector. In other words, the sensing direction of the sensor elements 450*a*, 450*b* is in the x-direction. As will be explained below, each sensor element 450*a*, 450*b* will sense the x-component that extends in opposing direction, such as the sensor element 450*a* sensing an x-component extending in the positive x-direction and sensor element 450*b* sensing an x-component extending in a negative x-direction. The magnet 430 is vertically orientated, and the north and south poles extend in a vertical direction (e.g., extend in the z-direction) that is perpendicular to the sensing direction (e.g., x-direction) of the sensor elements 450*a*, 450*b*.

FIG. 4A shows the vector 490 of the magnetic flux density of the useable field 431*a*, 431*b* passing through the sensor elements 450*a*, 450*b*, respectively. The vector 490 has an x-component 491 that is measured by the magnetic sensor 450*a*, 450*b*. The z-component of the vector 490 is not shown. As shown in FIG. 4A, the x-component 491 experienced by the first sensor element 450*a* extends in a first direction (e.g., positive x-direction) and the x-component 491 experienced by the second sensor element 450*b* extends in a second direction (e.g., negative x-direction) that is opposite of the first direction.

FIG. 4B shows the change in the vector (now shown as vector 490*a*) of the magnetic flux density after the carrier 130 is moved to the second position to increase the size of the gap G1. The x-component of the magnetic flux density vector increased as the size of the gap G1 increased while the magnitude of the magnetic flux density decreased as the gap G1 increased.

As shown in FIGS. 4A and 4B, the change in the size of the gap G1 modulates the detected magnetic flux density. FIG. 4B shows that the vector 490*a* has decreased in magnitude due to the increase in the size of the gap G1. The vector 490*a* shown in FIG. 4B has an x-component 491*a* that is larger than the x-component 491 of vector 490 shown in FIG. 4A due to the change in the size of the gap G1.

In some embodiments, the sensor elements 450*a,b* are configured to detect the x-component of the magnetic flux density vector. The sensor 400 may output a voltage signal based on the differences in the x-component of magnetic flux density vector detected by the sensor elements 450*a,b*. This voltage signal may then be correlated to a size of the gap.

The voltage signal produced by the sensor elements 450*a,b* is proportional to the detected magnetic flux density. Thus, the controller 150 may use the voltage signal to calculate the magnetic flux density detected by the sensor 400.

In some embodiments, the voltage signal produced by the sensor 400 does not have a linear relationship to the size of the gap G1. In other words, a unit increase in the voltage does not indicate the same unit increase in the size of the gap G1. Therefore, the voltage signal is linearized to determine the size of the gap G1 detected by the sensor 400.

The controller 150 may have a lookup table stored in the memory to linearize the voltage signal. The lookup table includes one or more inputs that are each indexed to an output. Each input corresponds to a voltage. The output is a size of the gap G1 that corresponds to the voltage. The controller 150 inputs the voltage of the voltage signal to output the size of the gap G1.

The sensor 400 may be calibrated to compensate for differences in the components of the sensor 400, such as variations in the sensitivity of the components or for variations in the position of the components. For example, each sensor element 450*a,b* may output different voltage signals for the same experienced x-component of a magnetic flux density vector. As another example, the first sensor element 450*a* may be closer to the membrane 206 than the second sensor element 450*b*. Thus, the voltage signal output of one or both of the magnetic sensor elements 450*a*, 450*b* may be inaccurate. The sensor 400 may be calibrated to account for the inaccuracy in the signal produced by each sensor element 450*a*, 450*b*. For example, the controller 150 or processor of the sensor 400 may adjust the voltage signal received by one or both of the sensor elements 450*a,b* by a factor or offset to correct for the error.

In some embodiments, the sensor 400 is calibrated prior to determining the size of the gap G1. In other words, the determining the size of the gap G1 requires first calibrating the sensor 400 and then comparing the voltage signal to the associated output value of the lookup table. This calibration may include accounting for the differences in the sensitivity and position of components of the sensor 400 as well as for the position of the underside 211 of the membrane 206. For example, the raw voltage signal output by the sensor elements 450*a*, 450*b* is calibrated prior to inputting the voltage signal into the lookup table. Thus, the calibrated voltage may be the input of the lookup table that is associated an output that corresponds with the size of the gap G1.

Figure 5:
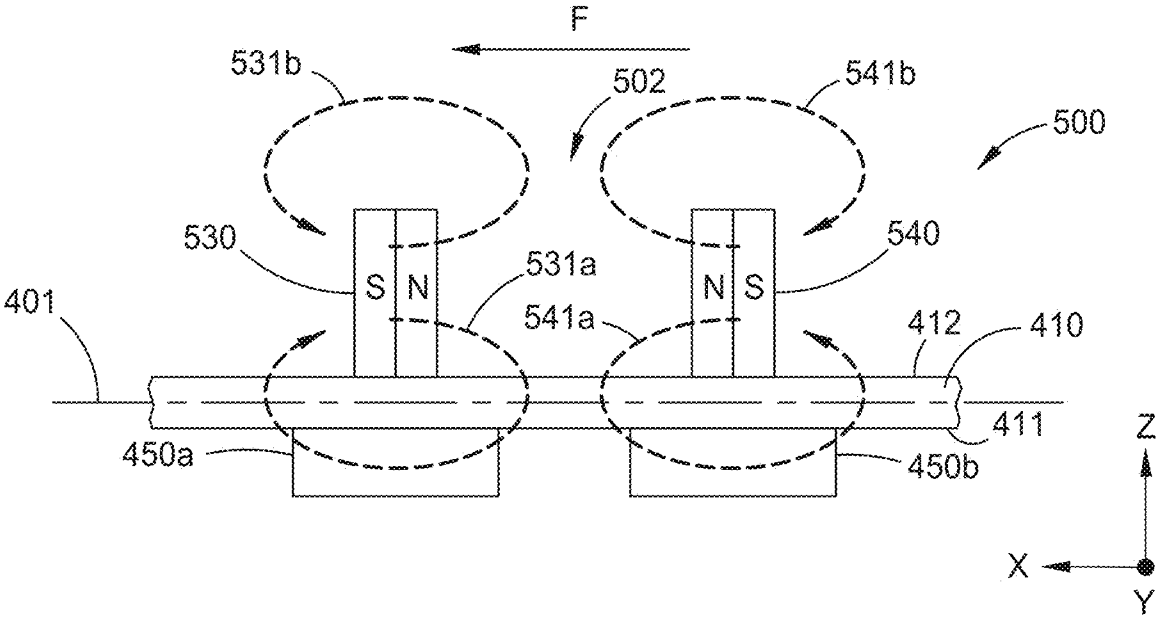
FIG. 5 illustrates a schematic side view of an exemplary magnetic sensor, in accordance with embodiments of the present disclosure.

FIG. 5 illustrates a schematic side-view of a magnetic sensor 500. The magnetic sensor 500 may be included within the sensor 270 to detect the gap G1 between the carrier 130 and the membrane 206. The magnetic sensor 500 has similar components as the magnetic sensor 400 as indicated by the reference signs without reciting the description of these components of the magnetic sensor 400 for brevity.

The magnetic sensor 500 includes a first magnet 530 and a second magnet 540 that have the same or substantially the same strength. The first and second magnets 530, 540 are horizontally oriented, unlike magnet 430, such that the north (N) and south(S) poles extend in in the horizontal direction. In other words, the magnetic axis of the first and second magnets 530, 540 are parallel or substantially parallel to the longitudinal axis 401 of the base 410. Additionally, the magnetic axis of the first and second magnets 530, 540 are co-axial and also are both parallel to the sensing direction (e.g., x-direction) of the sensor elements 450*a*, 450*b*. Additionally, the first and second magnets 530, 540 are positioned such that the same pole (such as the north pole) faces each other when placed on the base 410. This arrangement of the magnets 530, 540 causes the magnetic fields to circulate in opposing directions. The first magnet 530 generates a magnetic field that includes a first portion 531*a* and a second portion 531*b*. The second magnet 540 generates a magnetic field that includes a first portion 541*a* and a second portion 541*b*.

The first portions 531*a*, 541*a* are usable portions that circulate in opposing directions and have the same or substantially the same strength. The first magnet 530 is positioned on the second side 412 of the base 410 above the first sensor element 450*a* such that the first portion 531*a* passes through the first sensor element 450*a*. The second magnet 540 is positioned on the second side 412 of the base 410 above the second sensor element 450*b* such that the first portion 541*a* passes through the second sensor element 450*b*. A space 502 is between the first magnet 530 and the second magnet 540. In some embodiments, the usable field portion 531*a*, 541*a* pass through the first and second sensor elements 450*a*, 450*b*, respectively, above the membrane 206. In some embodiments, the first magnet 530 and second magnet 540 are spaced apart (e.g., not in contact) from the second side 412 with the base 410 being disposed between the magnets 530, 540 and the first and second sensor elements 450*a*, 450*b*. For example, the magnets 530, 540 may be attached to a sensor housing that the magnetic sensor 500 is disposed within.

In some embodiments, the sensor elements 450*a*, 450*b* are arranged to detect magnetic flux density in the horizontal direction as shown in FIG. 5. In some embodiments, the sensor elements 450*a*, 450*b* are arranged to detect the magnetic flux density in the vertical direction by reorienting the magnetic sensor 500 so that it is aligned vertically. The controller 150 compensates for the stray field in a similar manner as discussed above with respect to the magnetic sensor 400.

The strength of the first and second magnets 530, 540 are selected to avoid adversely affecting the ability of the linear stators 230 to levitate and drive the carrier 130. Thus, a benefit of the magnetic sensor 500 over legacy magnetic sensors is that the magnets 530, 540 have a strength sufficient to allow the sensor elements 450*a,b* to obtain measurements and/or data sufficient to determine the position of the carrier 130 while not applying a significant attraction force to the carrier 130.

Figure 6:
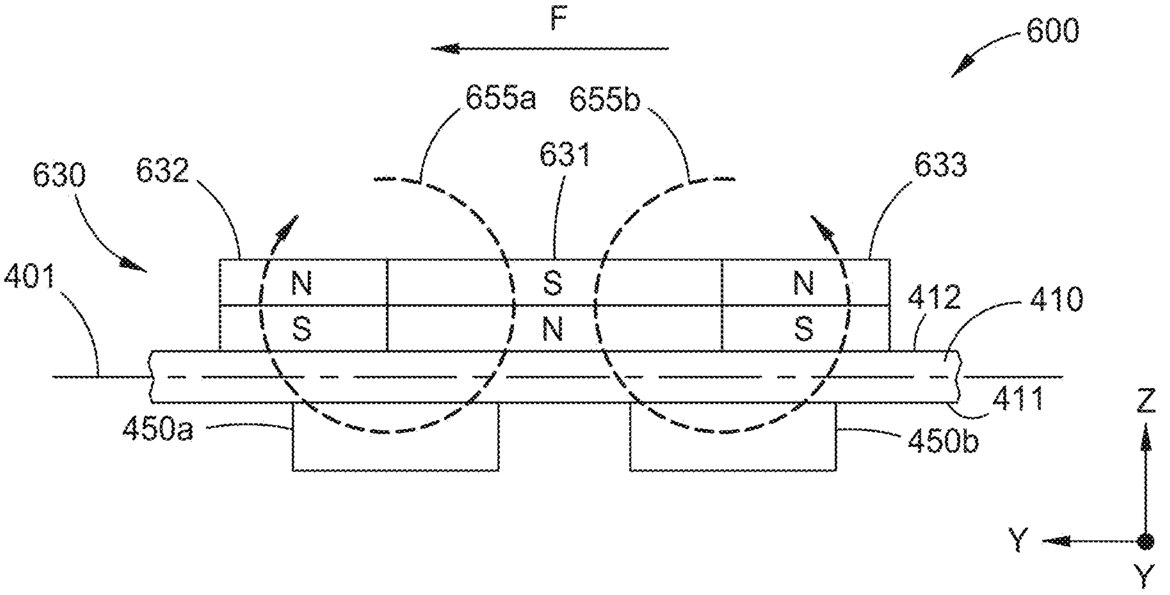
FIG. 6 illustrates a schematic side view of an exemplary magnetic sensor, in accordance with embodiments of the present disclosure.

FIG. 6 illustrates a schematic side-view of a magnetic sensor 600. The magnetic sensor 600 may be included within the sensor 270 to detect the gap G1 between the carrier 130 and the membrane 206. The magnetic sensor 600 has similar components as the magnetic sensor 400 as indicated by the reference signs without reciting the description of these components of the magnetic sensor 400 for brevity.

The magnetic sensor 600 has an array 630 of magnets on the second side 412 of the base 410. In some embodiments, the array 630 may be a Halbach array. In some embodiments, and as shown in FIG. 6, the array 630 includes a first magnet 631, a second magnet 632, and a third magnet 633. The first magnet 631 is shown disposed between the second and third magnets 632, 633. The first, second, and third magnets 631-633 are arranged in a vertical orientation with alternating poles, such that the magnetic axis of each magnet 631-633 is parallel or substantially perpendicular to the sensing direction (e.g., x-direction) of the sensor elements 450*a*, 450*b*. For example, the first magnet 631 is in a south-north vertical orientation while the second and third magnets 632, 633 are in a north-south vertical orientation as shown in FIG. 6. The strength of the array 630 is selected to facilitate sensing the position of the carrier 130 without adversely impacting the ability of the linear stators 230 to levitate and drive the carrier 130.

The array 630 generates a magnetic field that includes a first usable portion 655*a* that passes through the first sensor element 450*a* and a second usable portion 655*b* that passes through the second sensor element 450*b*. The first and second usable portions 655*a*, 655*b* circulate in opposite directions and have the same or substantially the same strength. In some embodiments, the sensor elements 450*a*, 450*b* are arranged to detect magnetic flux density in the horizontal direction as shown in FIG. 6. In some embodiments, the sensor elements 450*a*, 450*b* are arranged to detect the magnetic flux density in the vertical direction. The controller 150 compensates for the stray field in a similar manner as discussed above with respect to the magnetic sensor 400.

In some embodiments, the array 630 is in contact with the base 410, such as being disposed on the second side 412. In some embodiments, the array 630 is spaced apart (e.g., not in contact) from the base 410, with the base 410 being disposed between the array 630 and the first and second sensor elements 450*a*, 450*b*. For example, the array 630 may be attached to a sensor housing that the magnetic sensor 600 is disposed within.

Figure 7:
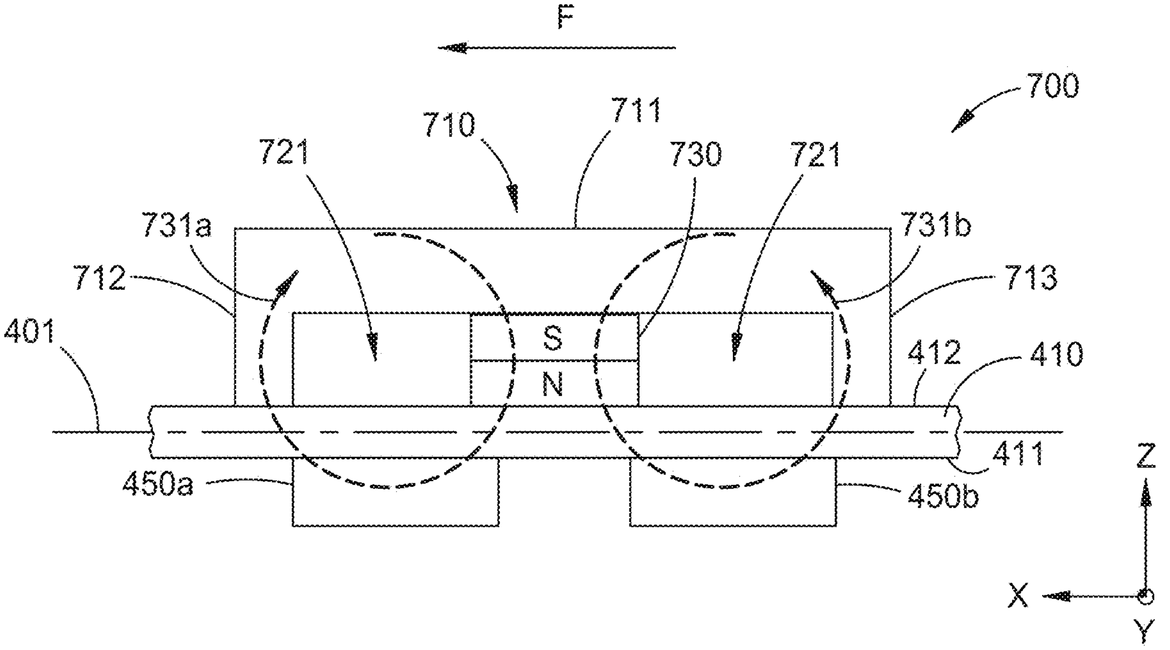
FIG. 7 illustrates a schematic side view of an exemplary magnetic sensor, in accordance with embodiments of the present disclosure.

FIG. 7 illustrates a schematic side-view of a magnetic sensor 700. The magnetic sensor 700 may be included within the sensor 270 to detect the gap G1 between the carrier 130 and the membrane 206. The magnetic sensor 700 has similar components as the magnetic sensor 400 as indicated by the reference signs without reciting the description of these components of the magnetic sensor 400 for brevity.

The magnetic sensor 700 includes a ferromagnetic member 710 (e.g., back iron) and a magnet 730 coupled to the second side of the base 410. The magnet 730 is vertically oriented such that the ends of the north and south poles extend and are aligned in the vertical direction (e.g., Z-direction). The magnet 730 is disposed between the ferromagnetic member 710 and the base 410. The strength of the magnet 730 is selected to facilitate sensing the position of the carrier 130 without adversely impacting the ability of the linear stators 230 to levitate and drive the carrier 130.

The ferromagnetic member 710 has a first portion 711, a second portion 712, and a third portion 713. The second and third portions 712, 713 are spaced horizontally from the magnet 730 and support the first portion 711 that is disposed above the magnet 730. A space 721 may be disposed on opposing sides of the magnet 430 between the magnet 430 and the ferromagnetic member 710. In some embodiments, the second and third portions 712, 713 are engaged with the base 410 at least partially to the outside (as shown in FIG. 7) or fully to the outside of the first and second sensor elements 450*a*, 450*b*.

The magnet 730 may be the same as magnet 430. The magnet 730 generates a magnetic field that includes a first usable portion 731*a* that passes through the first sensor element 450*a* and a second usable portion 731*b* that passes through the second sensor element 450*b*. The first and second usable portion 731*a*, 731*b* circulate in opposite directions and have the same or substantially the same strength as one another. Additionally, the first and second usable portions 731*a*, 731*b* are directed through the ferromagnetic member 710.

In some embodiments, the magnet 730 is in contact with the base 410 as shown in FIG. 7. In some embodiments, the magnet 730 is spaced apart (e.g., not in contact) from the second side 412 with the base 410 being disposed between the magnet 730 and the first and second sensor elements 450*a*, 450*b*. For example, the magnet 730 may be attached to a sensor housing that the magnetic sensor 400 is disposed within. The ferromagnetic member 710 may be formed within or attached to the sensor housing such that the ferromagnetic member 710 contacts the base 410 when the base 410 is installed within the sensor housing.

In some embodiments, the sensor elements 450*a*, 450*b* are arranged to detect magnetic flux density in the horizontal direction as shown in FIG. 7. In some embodiments, the sensor elements 450*a*, 450*b* are arranged to detect the magnetic flux density in the vertical direction. The controller 150 compensates for the stray field in a similar manner as discussed above with respect to the magnetic sensor 400. Without being bound by theory, the ferromagnetic member 710 shields the sensor elements 450*a*, 450*b* from some of the stray fields of the linear stator 230 which reduces the impact of the stray fields on the signal obtained from the magnetic sensor 700.

Figure 8A:
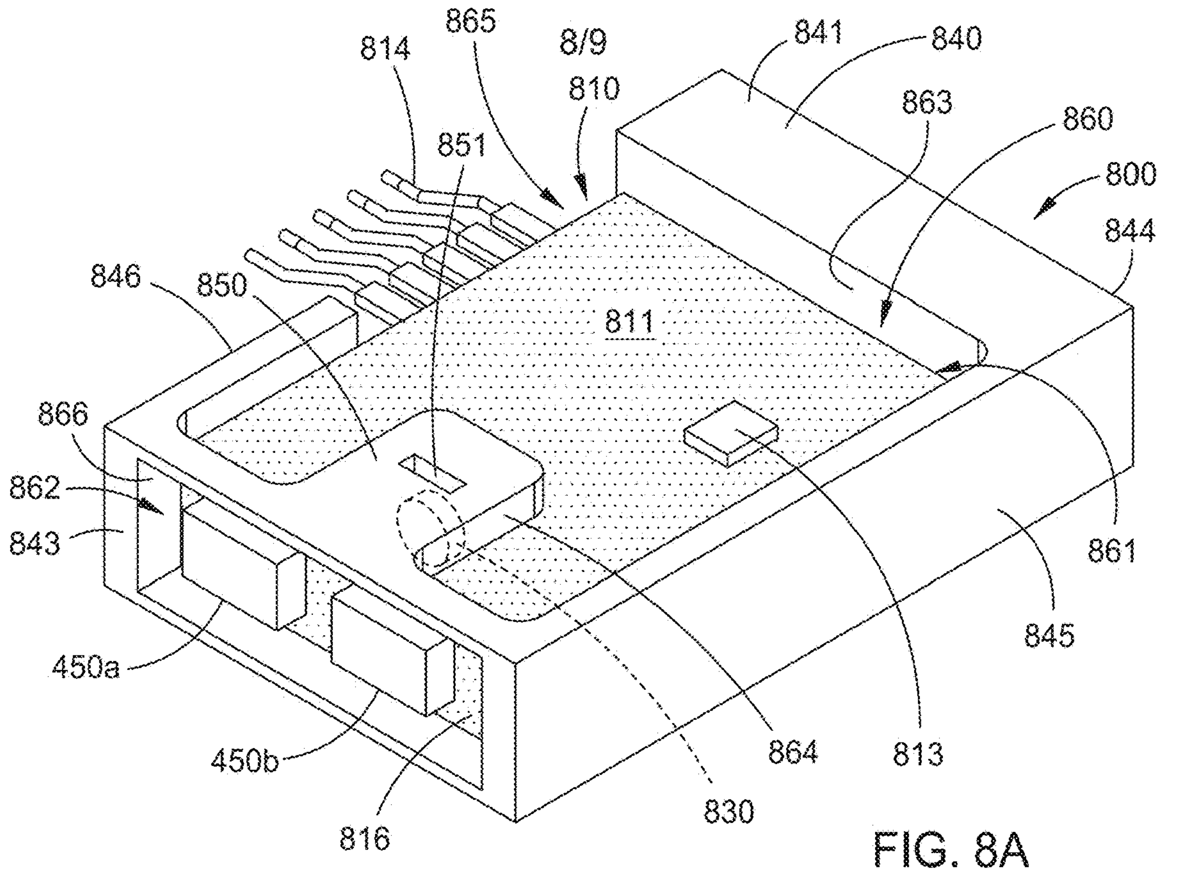
FIG. 8A illustrates a perspective view of an exemplary embodiment of a sensor, in accordance with embodiments of the present disclosure.
Figure 8B:
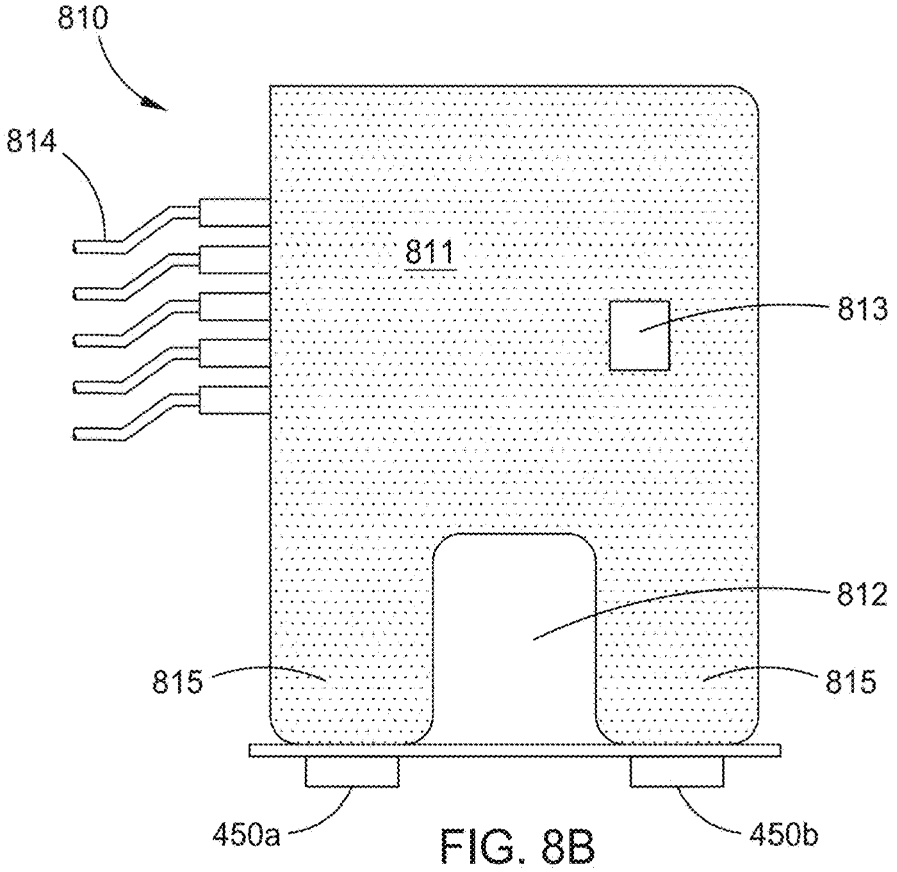
FIG. 8B illustrates a front view of a PCB assembly of the sensor illustrated in FIG. 8A, in accordance with embodiments of the present disclosure.
Figure 8C:
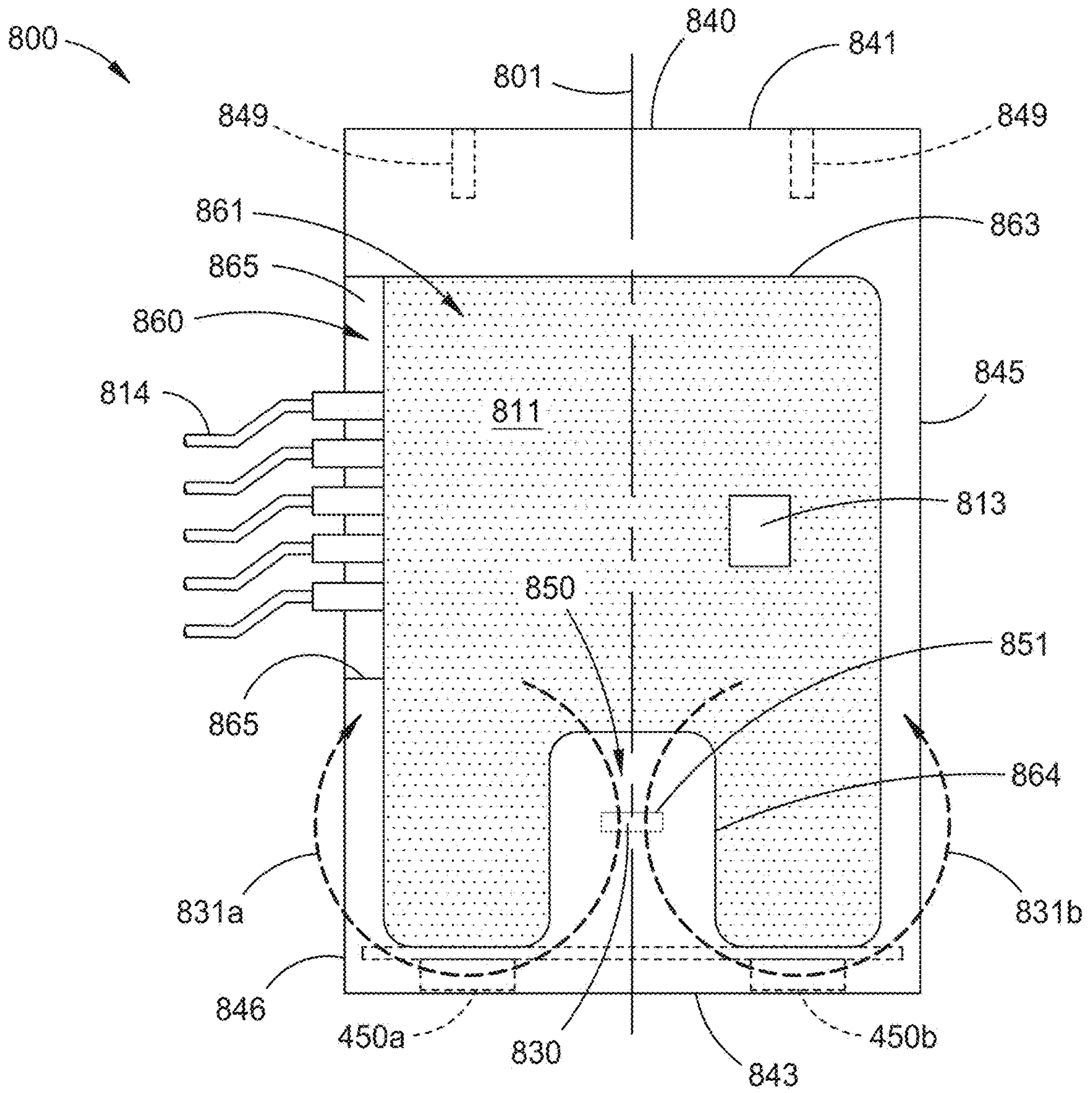
FIG. 8C illustrates a side view of a front of the sensor illustrated in FIG. 8A, in accordance with embodiments of the present disclosure.
Figure 8D:
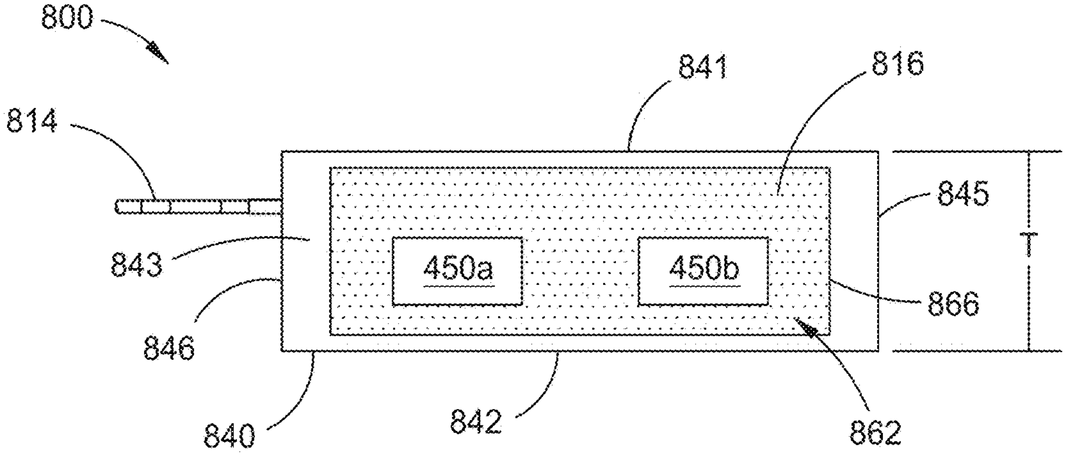
FIG. 8D illustrates a side view of a bottom of the sensor illustrated in FIG. 8A, in accordance with embodiments of the present disclosure.

FIGS. 8A-8D illustrate an exemplary embodiment of sensor 800. The sensor 800 may be substituted for sensor 270 to detect the gap G1 between the carrier, such as carrier 130 and carrier 300, and the membrane 206. The sensor 800 has similar components as the magnetic sensor 400 as indicated by the reference signs without reciting the description of these components of the magnetic sensor 400 for brevity. FIG. 8A illustrates a perspective view of the sensor 800. FIG. 8B illustrates a front view of a PCB assembly 810 of the sensor 800. FIG. 8C illustrates a side view of a front of the sensor 800. FIG. 8D illustrates a side view of a bottom of the sensor 800.

The sensor 800 includes the PCB assembly 810, a permanent magnet 830, a housing 840, a first sensor element 450*a*, and a second sensor element 450*b*. The magnet 830 is disposed in the housing 840 in a position relative to the first sensor element 450*a* and the second sensor element 450*b*. In other words, the magnet 830 is spaced apart from the PCB assembly 810 (e.g., not in contact with the PCB assembly 810).

FIG. 8B illustrates a front view of the PCB assembly 810. The illustrated PCB assembly 810 includes a first PCB 811 and a second PCB 816. The first PCB 811 is a first portion of the PCB assembly 810 and the second PCB 816 is a second portion of the PCB assembly 810. The first sensor element 450*a* and the second sensor element 450*b* are attached to the second PCB 816. The first PCB 811 and the second PCB 816 may be soldered together. One or more connectors 814, such as wires, are connected to the first PCB 811 such that the PCB assembly 810 can be in communication with the controller 150. The second PCB 816 is oriented such that the longitudinal axis of the second PCB 816 is perpendicular to the longitudinal axis of the first PCB 811.

The first PCB 811 may have a sensor 813 attached thereto. In some embodiments, the sensor 813 may be a temperature sensor to monitor the temperature of the sensor 800. For example, the temperature in the first region 207 may fluctuate due to the process occurring in the processing region 204. The temperature may be correlated with a decrease in the strength of the magnet 830. The voltage output from the sensor elements 450*a*, 450*b* may be calibrated based on the temperature. Also, the temperature may be monitored to avoid exceeding the Curie temperature. The controller 150 may stop the process within the processing region 204 if the temperature exceeds a threshold. Additionally, the temperature data may be used to evaluate if the magnet 830 needs to be replaced, such as when the Curie temperature is exceeded.

The PCB assembly 810 is disposed in the housing 840. The housing 840 is made of a non-magnetic material, such as being made from aluminum. The housing 840 includes a front side 841, a back side 842, a bottom side 843, a top side 844, a right side 845, and a left side 846. The PCB assembly 810 is disposed in a pocket 860 is formed in the housing 840. The housing 840 also includes a magnet housing portion 850 that houses the magnet 830. The magnet housing portion 850 partially defines the pocket 860. The sensor 800 can be fixed in a position within the first region 207, such as being attached to the frame member 220 by one or more fasteners inserted into fastener openings 849 in the housing 840.

The pocket 860 is a recess formed in the housing 840. The pocket 860 includes a first pocket portion 861 and a second pocket portion 862. The first PCB 811 is disposed in the first pocket portion 861 and the second PCB 816 is disposed in the second pocket portion 862. An outer surface 863 of the front side 841 partially defines the first pocket portion 861. An outer surface 864 of the magnet housing portion 850, which is portion of the surface 863, partially defines the first pocket portion 861. The pocket 860 also partially includes a cut out 865 formed in the left side 846. The cut out 865 is sized to receive the one or more connectors 814. The magnet housing portion 850 protrudes into the first pocket portion 861. In some embodiments, the magnet housing portion 850 extends from the back side 842 to the front side 841 such that the thickness T (FIG. 8D) of the magnet housing portion 850 is the same as the thickness T the sensor 800. The magnet housing portion 850 is received in a cutout 812 formed in the first PCB 811. Intermediate portions 815 of the first PCB 811, which are each a portion of the first PCB 811 on either side of the cutout 812, are disposed on opposing sides of the magnet housing portion 850. The intermediate portions 815 are connected to the second PCB 816, such as being soldered to the second PCB 816.

In some embodiments, the back side of the first PCB 811 may be flush against the bottom surface of the first pocket portion 861 (e.g., flush against the housing 840). In some embodiments, the first PCB 811 is not flush with the housing 840 within the first pocket portion 861 such that a space is present between at least part of the back side of the first PCB 811 and the bottom surface of the first pocket portion 861. For example, a portion of the magnet housing portion 850 may be disposed behind the first PCB 811.

In some embodiments, the first PCB 811 may be fastened to the housing 840 within the first pocket portion 861. For example, at least one fastener may be used to attach the first PCB 811 to the housing 840 within the pocket 860.

FIG. 8A and FIGS. 8C-8D show the second PCB 816 disposed in the second pocket portion 862. The second pocket portion 862 is in communication with the first pocket portion 861. The second pocket portion 862 is partially defined by an opening 866 in the bottom side 843 and a portion of the magnet housing portion 850. The sensor 800 is oriented in the first region 207 such that the opening 866 faces toward the membrane 206. In some embodiments, the second PCB 816 is positioned within the second pocket portion 862 such that the first sensor element 450*a* and second sensor element 450*b* are disposed in the opening 866, such as being at least partially disposed in the opening without protruding past the bottom side 843. In some embodiments, the second pocket portion 862 is sized such that the first sensor element 450*a* and second sensor element 450*b* are disposed above the opening 866 but are not disposed in the opening 866. In some embodiments, the first sensor element 450*a* and second sensor element 450*b* at least partially protrude from the opening 866.

In some embodiments, the bottom side 843 does not include an opening 866, such as being a uniform flat surface. The second pocket portion 862 may include a recess formed in front side 841 or the back side 842 to allow the second PCB 816 to be placed within the housing 840.

FIGS. 8A and 8C illustrate the magnet 830 disposed in an opening 851 of the magnet housing portion 850. The magnet 830 is inserted into the opening 851 to place the magnet 830 in a position relative to the first sensor element 450*a* and the second sensor element 450*b*. The magnet 830 may be the same as magnet 430. As shown in FIG. 8C, the magnet 830 generates a magnetic field that includes a first usable portion 831*a* that passes through the first sensor element 450*a* and a second usable portion 831*b* that passes through the second sensor element 450*b*. The first and second usable portion 831*a*, 831*b* circulate in opposite directions and have the same or substantially the same strength as one another. The sensor elements 450*a*, 450*b* detect changes in the magnetic flux density as the gap G1 changes due to the changing vertical (e.g., Z-position) of the carrier 130. The magnet 830 may be vertically oriented, such that the magnetic axis of the magnet 830 is parallel to the longitudinal axis 801 of the sensor 800. In some embodiments, and as shown in FIG. 8C, the magnet 830 is positioned such that the magnetic axis is coaxial with the longitudinal axis 801.

The opening 851 is shown as a blind opening formed in the magnet housing portion 840, in that the opening 851 does not extend all the way from the first side 841 to the back side 842. The opening 851 may have any suitable shape, such as being a rectangular recess as shown in FIGS. 8A and 8C, a circular blind bore, or a square recess. In some embodiments, the opening 851 is isolated from the pocket 860. For example, FIGS. 8A and 8C shows the entrance of the opening 851 formed a portion of the front side 841 that is not defining the pocket 860. In some embodiments, the entrance to the opening 851 may be fully or partially formed in the surface 864 of the magnet housing portion 850 that partially defines the pocket 860.

In some embodiments, the sensor elements 450*a*, 450*b* are arranged to detect magnetic flux density in the horizontal direction as shown in FIG. 8C. In other words, the sensor elements 450*a*, 450*b* are configured to detect the magnetic flux density in a direction perpendicular to the magnetic axis of the magnet 830. In some embodiments, the sensor elements 450*a*, 450*b* are arranged to detect the magnetic flux density in the vertical direction. The controller 150 compensates for the stray field in a similar manner as discussed above with respect to the magnetic sensor 400.

The sensor 800 may convert the magnetic flux density detected by the sensor elements 450*a*, 450*b* into a voltage signal that can be used by the controller 150 or processor on the PCB assembly 810 to determine the size of the gap G1. The dimension of the gap G1 may be determined by correlating the voltage signal generated by the sensor elements 450*a*, 450*b* to the size of the gap G1. For example, controller 150 may have a lookup table stored in the memory that indexes the voltage of the voltage signal to a corresponding size of the gap G1.

In some embodiments, the PCB assembly 810 includes one PCB instead of two PCBs. For example, the first sensor element 450*a* and the second sensor element 450*b* may be attached to a portion of the PCB that is disposed adjacent the opening 866 such that the first sensor elements 450*a*, 450*b* are disposed above the membrane 206.

In some embodiments, a potting material may be used to fully or at least partially fill in the pocket 860. For example, the first pocket portion 861 may be fully filled in such that the front side 841 is a flat surface. The second pocket portion 862 may be fully filed in such that the first sensor element 450*a* and second sensor element 450*b* are completely covered by the potting material. In some embodiments, the first sensor element 450*a* and second sensor element 450*b* are partially covered (e.g., partially uncovered) by the potting material, such that a portion of the surface of each of the first sensor element 450*a* and second sensor element 450*b* is exposed.

In one embodiment, a magnetic sensor comprises a base, at least one magnet, a first sensor element, and a second sensor element. The base including a first side and a second side. The at least one magnet disposed over the first side of the base, the at least one magnet generating magnetic flux. The first sensor element and the second sensor element being disposed over the second side, wherein the first sensor element and second sensor element are configured to measure magnetic flux density, and the magnetic flux generated by the at least one magnet is configured to pass through the first sensor element in a first direction and pass through the second sensor element in a second direction that is opposite to the first direction.

In one or more embodiments of the magnetic sensor, the base is a printed circuit board.

In one or more embodiments of the magnetic sensor, the magnetic sensor the first and second sensor elements are at least one of a Hall Effect element, Giant magnetoresistance (GMR) element, a Tunnel magnetoresistance (TMR) element, or an anisotropic magnetoresistance (AMR) element.

In one or more embodiments of the magnetic sensor, the at least one magnet comprises a single permanent magnet that is positioned between the first and second sensor elements.

In one or more embodiments of the magnetic sensor, the base has a thickness formed between the first and second side sufficient to cause the single magnet positioned against a surface of base to generate a usable field to pass through each of the first and second sensor elements.

In one or more embodiments of the magnetic sensor, the at least one magnet is an array of magnets disposed on the first side of the base, wherein the array of magnets includes a first magnet disposed between a second magnet and a third magnet, wherein first magnet, second magnet, and third magnet are arranged in a vertical orientation with alternating poles.

In one or more embodiments of the magnetic sensor, the at least one magnet has a magnetic axis that is perpendicular to a longitudinal axis of the base, wherein the at least one magnet is disposed between the first sensor element and the second sensor element.

In one or more embodiments of the magnetic sensor, the at least one magnet is arranged in a vertical orientation such that the north pole and south pole extend in a vertical direction, wherein the vertical direction is perpendicular to the first direction and the second direction.

In one or more embodiments of the magnetic sensor, the at least one magnet is a first magnet and a second magnet that each have a magnetic axis that is parallel to a longitudinal axis of the base, wherein the first magnet is disposed above the first sensor element and the second magnet is disposed above the second sensor element.

In one or more embodiments of the magnetic sensor, the at least one magnet is an array of magnets in a vertical orientation with alternating poles.

In one or more embodiments of the magnetic sensor, the magnetic sensor further including a ferromagnetic member disposed on the second side of the base, wherein the ferromagnetic member extends over the at least one magnet.

In one or more embodiments of the magnetic sensor, the base has a thickness between the first and second side sufficient to position the at least one magnet relative to the first and second sensor elements such that a usable field generated by the at least one magnet passes above a membrane of a process station disposed below the first and second sensor elements.

In one embodiments, a magnetic levitation actuator assembly includes a linear stator and a magnetic sensor. The magnetic sensor being positioned adjacent to the linear stator. The magnetic sensor comprises at least one magnet, a base, a first sensor element, and a second sensor element. The at least one magnet disposed on a first side of a base, the at least one magnet generating a magnetic flux. The first sensor element and the second sensor element being disposed on a second side of the base. The first sensor element and second sensor element are configured to measure magnetic flux density. The magnetic flux generated by the at least one magnet is configured to pass through the first sensor element in a first direction and pass through the second sensor element in a second direction that is opposite to the first direction.

In one or more embodiments of the magnetic levitation actuator assembly, a magnetic flux generated by the linear stator during operation is configured to substantially pass through the first sensor element and the second sensor element in the first direction.

In one or more embodiments of the magnetic levitation actuator assembly, the at least one magnet is an array of magnets disposed on the first side of the base, wherein the array of magnets includes a first magnet disposed between a second magnet and a third magnet, wherein first magnet, second magnet, and third magnet arranged in a vertical orientation with alternating poles.

In one or more embodiments of the magnetic levitation actuator assembly, the at least one magnet has a magnetic axis that is perpendicular to a longitudinal axis of the base, wherein the at least one magnet is disposed between the first sensor element and the second sensor element.

In one or more embodiments of the magnetic levitation actuator assembly, the at least one magnet is arranged in a vertical orientation such that the north pole and south pole extend in a vertical direction, wherein the vertical direction is perpendicular to the first direction and the second direction.

In one or more embodiments of the magnetic levitation actuator assembly, the at least one magnet is a first magnet and a second magnet that each have a magnetic axis that is parallel to a longitudinal axis of the base, wherein the first magnet is disposed above the first sensor element and the second magnet is disposed above the second sensor element.

In one embodiment, a method of controlling a carrier includes actuating linear stators to levitate a carrier underneath a membrane and a sensor, the sensor including a magnet disposed on a first side of a base and a first sensor element and a second sensor element disposed on a second side of the base. The method further includes determining a distance between the membrane and the carrier levitated below the membrane. Determining the distance includes detecting a magnetic flux density using the first sensor element and the second sensor element, wherein the first sensor element and second sensor element detect magnetic flux density in the horizontal direction. Determining the distance further includes generating a voltage signal based on the detected magnetic flux density. Determining further includes inputting the voltage signal and outputting the distance that is indexed to the voltage signal.

In one or more embodiments, the method of controlling the carrier further includes changing a position of the carrier relative to the membrane based on the determined distance by adjusting an electromagnetic field of the linear stators to increase or decrease the distance between the membrane and the carrier.

In one or more embodiments, the method of controlling the carrier further includes comparing the distance to a stored value prior to changing the position of the carrier. The method further includes changing the position of the carrier when the distance is outside of a threshold range of the stored value.

In one embodiments, a magnetic sensor includes a sensor housing, a magnet, a printed circuit board assembly, a first sensor element, and a second sensor element. The sensor housing including a pocket and a magnet opening. The magnet being disposed in the magnet opening. The printed circuit board assembly being disposed in the pocket, the printed circuit board assembly including a first portion and a second portion. The first sensor element and the second sensor element being disposed on the second portion, wherein the first sensor element and second sensor element are configured to measure magnetic flux density, and the magnetic flux generated by the magnet is configured to pass through the first sensor element in a first direction and pass through the second sensor element in a second direction that is opposite to the first direction.

In one or more embodiments of the magnetic sensor, the first and second sensor elements are at least one of a Hall Effect element, Giant magnetoresistance (GMR) element, a Tunnel magnetoresistance (TMR) element, or an anisotropic magnetoresistance (AMR) element.

In one or more embodiments of the magnetic sensor, the magnet is oriented within the opening such that a magnetic axis of the magnet is coaxial to a longitudinal axis of the sensor housing.

In one or more embodiments of the magnetic sensor, the first portion of the printed circuit board assembly includes a temperature sensor.

In one or more embodiments of the magnetic sensor, the magnetic sensor further comprises a potting material disposed in the pocket, wherein at least a portion of the first sensor element and the second sensor element are at least partially uncovered by the potting material.

In one or more embodiments of the magnetic sensor, the first portion of the printed circuit board assembly is a first printed circuit board and the second portion of the printed circuit board assembly is a second printed circuit board connected to the first printed circuit board.

In one or more embodiments of the magnetic sensor, the sensor housing includes a protrusion partially defining the pocket, and the magnet opening is disposed in the protrusion.

In one or more embodiments of the magnetic sensor, the sensor housing is formed from aluminum.

In one or more embodiments of the magnetic sensor, the magnet opening is isolated from the pocket.

In one embodiment, a magnetic sensor comprises a magnet generating a magnetic field, a housing, a printed circuit board assembly, a first sensor element, and a second sensor element. The sensor housing includes a first side, a second side, a pocket, and a magnet housing portion. The pocket includes a first pocket portion and a second pocket portion, wherein the first pocket portion is formed in the first side, the first pocket portion being defined by an outer surface of the first side, and the second pocket portion of the pocket is formed in the second side, and the second pocket portion including an opening in the second side. The magnet housing portion at least partially defined by the outer surface of the first side that defines the first pocket portion, the magnet housing portion including a magnet opening, and wherein the magnet is disposed in the magnet opening. The printed circuit board assembly disposed in the pocket, the printed circuit board assembly including a first PCB portion and a second PCB portion. The first sensor element and the second sensor element being disposed on the second PCB portion and disposed in the second pocket portion, wherein the first sensor element and second sensor element are configured to measure magnetic flux density of the magnetic field.

In one or more embodiments of the magnetic sensor, the magnet is oriented within the opening such that a magnetic axis of the magnet is coaxial to a longitudinal axis of the sensor housing.

In one or more embodiments of the magnetic sensor, the magnetic sensor further comprises a potting material disposed in the pocket, wherein at least a portion of the first sensor element and the second sensor element are at least partially uncovered by the potting material.

In one or more embodiments of the magnetic sensor, the first and second sensor elements are at least one of a Hall Effect element, Giant magnetoresistance (GMR) element, a Tunnel magnetoresistance (TMR) element, or an anisotropic magnetoresistance (AMR) element.

In one or more embodiments of the magnetic sensor, the first portion of the PCB assembly is a first printed circuit board and the second portion of the PCB assembly is a second printed circuit board connected to the first printed circuit board.

In one or more embodiments of the magnetic sensor, a temperature sensor is disposed on the first printed circuit board.

In one or more embodiments of the magnetic sensor, the sensor housing includes a third side partially defined by the first pocket portion.

In one embodiment, an assembly for a substrate station comprises a linear stator and a magnetic sensor positioned adjacent to the linear stator. The magnetic sensor comprises a sensor housing, a permanent magnet, a printed circuit board assembly, a first sensor element, and a second sensor element. The sensor housing including a pocket and a magnet opening. The permanent magnet being disposed in the magnet opening. The printed circuit board assembly being disposed in the pocket, the printed circuit board assembly including a first portion and a second portion. The first sensor element and the second sensor element being disposed on the second portion, wherein the first sensor element and second sensor element are configured to measure magnetic flux density, and the magnetic flux generated by the magnet is configured to pass through the first sensor element in a first direction and pass through the second sensor element in a second direction that is opposite to the first direction.

In one or more embodiments of the assembly, the first and second sensor elements are at least one of a Hall Effect element, Giant magnetoresistance (GMR) element, or a Tunnel magnetoresistance (TMR) element.

In one or more embodiments of the assembly, the assembly further comprises a frame member, wherein the linear stator is attached to a first side of the frame member and the magnetic sensor is attached to a second side of the frame member.

In one or more embodiments of the assembly, the magnet is arranged in a vertical orientation within the magnetic opening such that the north pole and south pole extend in a vertical direction, wherein the vertical direction is perpendicular to the first direction and the second direction.

While the foregoing is directed to embodiments of the present disclosure, other and further embodiments of the disclosure may be devised without departing from the basic scope thereof, and the scope thereof is determined by the claims that follow.

What is claimed is:

1. A magnetic sensor, comprising:

a sensor housing including a pocket and a magnet opening, the pocket comprising a first pocket portion and a second pocket portion;

a magnet disposed in the magnet opening;

a printed circuit board assembly disposed in the pocket, the printed circuit board assembly including a first portion and a second portion, wherein the first portion of the printed circuit board assembly is a first printed circuit board and the second portion of the printed circuit board assembly is a second printed circuit board connected to the first printed circuit board, wherein the first printed circuit board is positioned in the first pocket portion, and wherein the second printed circuit board is positioned in the second pocket portion and oriented such that a longitudinal axis of the second printed circuit board is perpendicular to a longitudinal axis of the first printed circuit board; and a first sensor element and a second sensor element disposed on the second printed circuit board in the second pocket portion, wherein the first sensor element and second sensor element are configured to measure magnetic flux density, and the magnetic flux generated by the magnet is configured to pass through the first sensor element in a first direction and pass through the second sensor element in a second direction that is opposite to the first direction.

2. The magnetic sensor of claim 1, wherein at least one of the first and second sensor elements is a Hall Effect element, a Giant magnetoresistance (GMR) element, a Tunnel magnetoresistance (TMR) element, or an anisotropic magnetoresistance (AMR) element.

3. The magnetic sensor of claim 1, wherein the magnet is oriented within the magnet opening such that a magnetic axis of the magnet is coaxial to a longitudinal axis of the sensor housing.

4. The magnetic sensor of claim 1, wherein the first printed circuit board includes a temperature sensor.

5. The magnetic sensor of claim 1, further comprising:

a potting material disposed in the pocket, wherein at least a portion of the first sensor element and the second sensor element is at least partially uncovered by the potting material.

6. The magnetic sensor of claim 1, wherein:

the sensor housing includes a protrusion partially defining the pocket, and the magnet opening is disposed in the protrusion.

7. The magnetic sensor of claim 1, wherein the sensor housing is formed from aluminum.

8. The magnetic sensor of claim 1, wherein the magnet opening is isolated from the pocket.

9. A magnetic sensor, comprising:

a magnet generating a magnetic field;

a sensor housing including:

a first side;

a second side;

a pocket including a first pocket portion and a second pocket portion, wherein the first pocket portion is formed in the first side, the first pocket portion being defined by an outer surface of the first side, and the second pocket portion of the pocket is formed in the second side, and the second pocket portion including an opening in the second side; and a magnet housing portion at least partially defined by the outer surface of the first side that defines the first pocket portion, the magnet housing portion including a magnet opening, and wherein the magnet is disposed in the magnet opening;

a printed circuit board ("PCB") assembly disposed in the pocket, the printed circuit board assembly including a first PCB portion and a second PCB portion, wherein the first portion of the printed circuit board assembly is a first printed circuit board and the second portion of the printed circuit board assembly is a second printed circuit board connected to the first printed circuit board, wherein the first printed circuit board is positioned in the first pocket portion, and wherein the second printed circuit board is positioned in the second pocket portion and oriented such that a longitudinal axis of the second printed circuit board is perpendicular to a longitudinal axis of the first printed circuit board; and a first sensor element and a second sensor element disposed on the second PCB portion and disposed in the second pocket portion, wherein the first sensor element and the second sensor element are configured to measure magnetic flux density of the magnetic field.

10. The magnetic sensor of claim 9, wherein the magnet is oriented within the opening such that a magnetic axis of the magnet is coaxial to a longitudinal axis of the sensor housing.

11. The magnetic sensor of claim 9, further comprising:

a potting material disposed in the pocket, wherein at least a portion of the first sensor element and the second sensor element are at least partially uncovered by the potting material.

12. The magnetic sensor of claim 9, wherein at least one of the first and second sensor elements is a Hall Effect element, a Giant magnetoresistance (GMR) element, a Tunnel magnetoresistance (TMR) element, or an anisotropic magnetoresistance (AMR) element.

13. The magnetic sensor of claim 9, wherein a temperature sensor is disposed on the first printed circuit board.

14. The magnetic sensor of claim 9, wherein the sensor housing includes a third side partially defined by the first pocket portion.

15. An assembly for a substrate station, comprising:

a linear stator;

a magnetic sensor positioned adjacent to the linear stator, wherein the magnetic sensor comprises:

a sensor housing including a pocket and a magnet opening, the pocket comprising a first pocket portion and a second pocket portion;

a permanent magnet disposed in the magnet opening;

a printed circuit board assembly disposed in the pocket, the printed circuit board assembly including a first portion and a second portion, wherein the first portion of the printed circuit board assembly is a first printed circuit board and the second portion of the printed circuit board assembly is a second printed circuit board connected to the first printed circuit board, wherein the first printed circuit board is positioned in the first pocket portion, and wherein the second printed circuit board is positioned in the second pocket portion and oriented such that a longitudinal axis of the second printed circuit board is perpendicular to a longitudinal axis of the first printed circuit board; and a first sensor element and a second sensor element disposed on the second printed circuit board in the second pocket portion, wherein the first sensor element and second sensor element are configured to measure magnetic flux density, and the magnetic flux generated by the magnet is configured to pass through the first sensor element in a first direction and pass through the second sensor element in a second direction that is opposite to the first direction.

16. The assembly of claim 15, wherein at least one of the first and second sensor elements is a Hall Effect element, a Giant magnetoresistance (GMR) element, or a Tunnel magnetoresistance (TMR) element.

17. The assembly of claim 15, further comprising:

a frame member, wherein the linear stator is attached to a first side of the frame member and the magnetic sensor is attached to a second side of the frame member.

18. The assembly of claim 15, wherein the magnet is arranged in a vertical orientation within the magnetic opening such that a north pole and a south pole extend in a vertical direction, wherein the vertical direction is perpendicular to the first direction and the second direction.

* * * * *